(12) United States Patent
Xiong et al.

(10) Patent No.: US 12,041,720 B2
(45) Date of Patent: Jul. 16, 2024

(54) DISPLAY DEVICE AND MANUFACTURING METHOD THEREOF

(71) Applicants: Chengdu BOE Optoelectronics Technology Co., Ltd., Chengdu (CN); BOE TECHNOLOGY GROUP CO., LTD., Beijing (CN)

(72) Inventors: Ren Xiong, Beijing (CN); Fan Li, Beijing (CN); Qiang Tang, Beijing (CN); Fei Shang, Beijing (CN); Haijun Qiu, Beijing (CN); Yuanyuan Chai, Beijing (CN); Huiqiang Song, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/312,708

(22) Filed: May 5, 2023

(65) Prior Publication Data
US 2023/0276572 A1 Aug. 31, 2023

Related U.S. Application Data

(63) Continuation of application No. 17/273,593, filed as application No. PCT/CN2020/094610 on Jun. 5, 2020, now Pat. No. 11,690,174.

(51) Int. Cl.
*H05K 1/11* (2006.01)
*G06F 3/041* (2006.01)
(Continued)

(52) U.S. Cl.
CPC ........... *H05K 1/118* (2013.01); *G06F 3/0412* (2013.01); *G06F 3/0443* (2019.05);
(Continued)

(58) Field of Classification Search
CPC ........ H05K 1/118; H05K 1/189; H05K 3/363; G06F 3/0446; G06F 3/0443; G06F 3/0412; H01R 12/61
(Continued)

(56) References Cited

U.S. PATENT DOCUMENTS

2015/0187845 A1 7/2015 Kim
2018/0210297 A1* 7/2018 Xu ..................... H01R 13/6594
(Continued)

FOREIGN PATENT DOCUMENTS

| CN | 105573557 A | 5/2016 |
| CN | 110109570 A | 8/2019 |
| KR | 10-2018-0038703 A | 4/2018 |

OTHER PUBLICATIONS

U.S. Notice of Allowance in U.S. Appl. No. 17/273,593 dated Feb. 16, 2023.
(Continued)

*Primary Examiner* — Andargie M Aychillhum
(74) *Attorney, Agent, or Firm* — Collard & Roe, P.C.; William Collard

(57) ABSTRACT

A display device and a manufacturing method thereof are provided. The display device includes a display panel (20) and a flexible circuit board electrically connected with the display panel (20). The flexible circuit board includes a first circuit board (11), a second circuit board (22) and a conductive portion; the first circuit board (11) includes a first substrate (100), and a main contact pad, a first wire (501) and a second wire (502) provided on the first substrate (100); the second circuit board (22) includes a second substrate (200), a relay contact pad and a third wire (210) provided on the second substrate (200); and the conductive portion is configured for electrically connecting the main contact pad and the relay contact pad.

20 Claims, 20 Drawing Sheets

(51) Int. Cl.
*G06F 3/044* (2006.01)
*H01R 12/61* (2011.01)
*H05K 3/36* (2006.01)
*H05K 1/18* (2006.01)
*H10K 59/131* (2023.01)
*H10K 59/179* (2023.01)

(52) U.S. Cl.
CPC ........... *G06F 3/0446* (2019.05); *H01R 12/61* (2013.01); *H05K 3/363* (2013.01); *G06F 3/04164* (2019.05); *H05K 1/189* (2013.01); *H05K 2201/041* (2013.01); *H05K 2201/09227* (2013.01); *H05K 2201/09236* (2013.01); *H05K 2201/09381* (2013.01); *H05K 2201/0939* (2013.01); *H05K 2201/09481* (2013.01); *H05K 2201/10128* (2013.01); *H10K 59/131* (2023.02); *H10K 59/179* (2023.02)

(58) Field of Classification Search
USPC ........................................................ 345/174
See application file for complete search history.

(56) References Cited

U.S. PATENT DOCUMENTS

2019/0146621 A1* 5/2019 Aoki ..................... G06F 3/0412
   345/174
2019/0310302 A1* 10/2019 Lee ......................... G06F 3/044

OTHER PUBLICATIONS

U.S. Notice of Allowance in U.S. Appl. No. 17/273,593 dated May 16, 2023.
Chinese International Search Report in PCT/CN2020/094610 dated Mar. 2, 2021 with English translation.
Written Opinion in PCT/CN2020/094610 dated Mar. 2, 2021 with English translation.

* cited by examiner

DISPLAY DEVICE AND MANUFACTURING METHOD THEREOF

CROSS-REFERENCE TO RELATED APPLICATION

This application is a continuation of U.S. Ser. No. 17/273,593 filed on Mar. 4, 2021, which is a national stage application of international application PCT/CN2020/094610 filed on Jun. 5, 2020, the disclosures of all of these applications hereby incorporated herein by reference in their entirety.

TECHNICAL FIELD

Embodiments of the disclosure relate to a display device and a manufacturing method of the display device.

BACKGROUND

A display panel is bonded with a flexible circuit board, and the flexible circuit board is connected with a display signal source, so that a display driving signal is input into the display panel through wires provided in the flexible circuit board. For the display panel having touch function, a touch signal for example is also input into the display panel through the flexible circuit board, thus the total number of the wires in the flexible circuit board is increased.

In order to reduce density of the wires in the flexible circuit board, the wires are provided in many different layers of the flexible circuit board, which results in problems such as higher cost and lower defect-free ratio.

SUMMARY

An embodiment of the disclosure provides a display device. The display device comprises: a display panel and a flexible circuit board, and the display panel comprises a display area and a peripheral area;

in the display area, a plurality of sub-pixels provided in an array, and a plurality of scanning lines and a plurality of data lines intersecting each other are provided in the display area, the plurality of scanning lines extend along a first direction and the plurality of data lines extend along a second direction different from the first direction;

the peripheral area surrounds the display area, a plurality of first connection terminals, a plurality of second connection terminals, a plurality of third connection terminals, a plurality of fourth connection terminals, a plurality of fifth connection terminals and a driving control circuit are provided in the peripheral area on a first side of the display panel, the plurality of data lines are respectively electrically connected with the plurality of first connection terminals, the plurality of first connection terminals are spaced from the plurality of second connection terminals, the driving control circuit is electrically connected with the plurality of first connection terminals and the plurality of second connection terminals, the fifth connection terminals are respectively electrically connected with the second connection terminals through connection wires, a total number of the plurality of first connection terminals is larger than that of the plurality of fifth connection terminals, and the plurality of fifth connection terminals are closer to an edge of the first side of the display panel than the plurality of first connection terminals and the plurality of second connection terminals;

the flexible circuit board is electrically connected with the display panel, a side of the flexible circuit board is provided with a plurality of first wiring terminals, a plurality of second wiring terminals and a plurality of third wiring terminals, the plurality of first wiring terminals are respectively electrically connected with the plurality of third connection terminals, the plurality of second wiring terminals are respectively electrically connected with the plurality of fourth connection terminals, the plurality of third wiring terminals are respectively electrically connected with the plurality of fifth connection terminals, and the flexible circuit board comprises a first circuit board, a second circuit board and a conductive portion:

the first circuit board comprises a first substrate, and a main contact pad, a first wire and a second wire provided on the first substrate, the main contact pad comprises a first contact pad and a second contact pad, the first wire is electrically connected with the first contact pad, and the second wire is electrically connected with the second contact pad;

the second circuit board comprising a second substrate, and a relay contact pad and a third wire provided on the second substrate, the relay contact pad comprises a third contact pad and a fourth contact pad, and the third contact pad and the fourth contact pad are connected with each other through the third wire;

the conductive portion is configured for electrically connecting the main contact pad and the relay contact pad, the conductive portion comprises a first conductive portion and a second conductive portion;

herein, the first circuit board and the second circuit board are different from each other in shape, the second circuit board is stacked on the first circuit board, so that the second circuit board is provided on a side of the first contact pad and the second contact pad away from the first substrate, the first contact pad and the third contact pad are electrically connected with each other through the first conductive portion, and the second contact pad and the fourth contact pad are electrically connected with each other through the second conductive portion.

In at least one embodiment, the conductive portion and the main contact pad are directly connected with each other.

In at least one embodiment, the display panel comprises a base substrate, the plurality of sub-pixels are provided on the base substrate, each sub-pixel comprises an organic electroluminescent element, a touch conductive layer is provided on the organic electroluminescent elements, a plurality of first touch electrodes and a plurality of second touch electrodes are provided in the touch conductive layer, the plurality of first touch electrodes constitute a first touch electrode line extending along the first direction, the plurality of second touch electrodes constitute a second touch electrode line extending along the second direction, the first touch electrode line and second touch electrode line intersecting each other, first touch-electrode wires electrically connected with the first touch electrodes and second touch-electrode wires electrically connected with the second touch electrodes are provided in the peripheral area of the display panel, the first touch-electrode wires are electrically connected with the fourth connection terminals, and the second touch-electrode wires are electrically connected with the third connection terminals.

In at least one embodiment, a vertical distance between the touch conductive layer and a plane where the plurality of data lines are located is a first distance, the display panel further comprises a driving control line electrically connected with the driving control circuit through the third wiring terminal, the driving control line intersects the third wire in space, a vertical distance between the driving control line and the third wire is a second distance, and the first distance is different from the second distance.

In at least one embodiment, the first distance is smaller than the second distance.

In at least one embodiment, a distance between the touch conductive layer and the base substrate is greater than a distance between the third connection terminal and the base substrate.

In at least one embodiment, the first wire is connected with the first contact pad through a first transition connection portion, the second wire is connected with the second contact pad through a second transition connection portion, and the third wire is connected with the third contact pad and/or the fourth contact pad through a third transition connection portion; a width of the first transition connection portion is gradually reduced in a direction from the first contact pad to the first wire, a width of the second transition connection portion is gradually reduced in a direction from the second contact pad to the second wire, and a width of the third transition connection portion is gradually reduced in a direction from the third contact pad and/or the fourth contact pad to the third wire.

In at least one embodiment, the second circuit board further comprises: a plurality of through holes penetrating through the second substrate, wherein each through hole is provided to correspond to the main contact pad; and a connection portion which covers at least a portion of an inner wall of the through hole and is connected with the relay contact pad, herein, the conductive portion fills in the through hole and is connected with the connection portion, and the conductive portion extends from the through hole toward the first substrate to be connected with the main contact pad on the first substrate.

In at least one embodiment, a width of each of the first wire, the second wire and the third wire is smaller than a width of an orthographic projection of an inner profile of the connection portion on the second substrate and is smaller than a width of an orthographic projection of an outer profile of the relay contact pad on the second substrate.

In at least one embodiment, the width of each of the first wire, the second wire and the third wire is smaller than a lateral size of the through hole.

In at least one embodiment, the first circuit board comprises a plurality of first contact pads, a plurality of second contact pads, a plurality of first wires and a plurality of second wires; the plurality of the first contact pads are provided in an array, a first gap exists between two adjacent first contact pads, and at least one first wire of the plurality of first wires passes through the first gap and is connected with another first contact pad different from the two adjacent first contact pads; the plurality of second contact pads are provided in an array, a second gap exists between two adjacent second contact pads, and at least one second wire of the plurality of second wires passes through the second gap and is connected with another second contact pad different from the two adjacent second contact pads.

In at least one embodiment, the second circuit board comprises a plurality of third contact pads, a plurality of fourth contact pads and a plurality of third wires; the plurality of third contact pads are provided in an array, a third gap exists between two adjacent third contact pads, and at least one third wire of the plurality of third wires passes through the third gap and is connected with another third contact pad different from the two adjacent third contact pads; the plurality of the fourth contact pads are provided in an array, a fourth gap exists between two adjacent fourth contact pads, and at least one another third wire of the plurality of third wires passes through the fourth gap and is connected with another fourth contact pad different from the two adjacent fourth contact pads.

In at least one embodiment, a first connection line is drawn between center points of the two adjacent first contact pads, the at least one first wire forms an intersection point with the first connection line, and a difference between a distance between the center point of one of the two adjacent first contact pads and the intersection point and a distance between the center point of the other of the two adjacent first contact pads and the intersection point is smaller than or equal to a width of the at least one first wire; a second connection line is drawn between center points of the two adjacent second contact pads, the at least one second wire forms an intersection point with the second connection line, and a difference between a distance between the center point of one of the two adjacent second contact pads and the intersection point and a distance between the center point of the other of the two adjacent second contact pads and the intersection point is smaller than or equal to a width of the at least one second wire.

In at least one embodiment, a third connection line is drawn between center points of the two adjacent third contact pads, the at least one third wire forms an intersection point with the third connection line, and a difference between a distance between the center point of one of the two adjacent third contact pads and the intersection point and a distance between the center point of the other of the two adjacent third contact pads and the intersection point is smaller than or equal to a width of the at least one third wire.

In at least one embodiment, the conductive portion is further in contact with at least a part of a surface of the relay contact pad.

In at least one embodiment, the relay contact pad comprises a first portion provided on a side of the second substrate away from the first substrate and a second portion provided on a side of the second substrate close to the first substrate, and the conductive portion is in contact with at least a surface of the second portion of the relay contact pad.

In at least one embodiment, an orthographic projection of the through hole on the second substrate has a first closed shape.

In at least one embodiment, the first closed shape comprises a circle, an ellipse or a cross shape.

In at least one embodiment, the cross shape has four convex portions, and every two adjacent convex portions are connected with each other by an arc.

In at least one embodiment, an orthographic projection of the through hole on the second substrate is provided in the orthographic projection of the outer profile of the relay contact pad on the second substrate, and the orthographic projection of the outer profile of the relay contact pad on the second substrate has a second closed shape.

In at least one embodiment, the second closed shape comprises a circle, a rectangle, an ellipse or an irregular shape.

In at least one embodiment, the second closed shape has a first length parallel to a first direction of the second substrate and a second length parallel to a second direction of the second substrate, the first direction and the second direction are perpendicular to each other, and a maximum value of the first length is greater than a maximum value of the second length.

In at least one embodiment, the first length is from 0.1 mm to 0.7 mm and the second length is from 0.1 mm to 0.4 mm.

In at least one embodiment, the plurality of through holes comprise: a plurality of first through holes, wherein each first through hole corresponds to the first contact pad and the third contact pad, the plurality of first through holes are provided in a plurality of lines, and the first through holes in odd lines are staggered with the first through holes in even lines; a plurality of second through holes, wherein each second through hole corresponds to the second contact pad and the fourth contact pad, the plurality of second through holes are provided in a plurality of lines, and the second through holes in odd lines are staggered with the second through holes in even lines.

In at least one embodiment, the second circuit board further comprises an insulating layer provided on the second substrate, the insulating layer is provided on a side of the relay contact pad away from the second substrate, and the insulating layer comprises an opening exposing the through hole and exposing a part of the relay contact pad around the through hole.

In at least one embodiment, an orthographic projection of the insulating layer on the second substrate and an orthographic projection of the relay contact pad on the second substrate have an overlapping region, and the overlapping region surrounds the orthographic projection of the through hole on the second substrate.

In at least one embodiment, an outer profile of the overlapping region has a third length parallel to a first direction of the second substrate and a fourth length parallel to a second direction of the second substrate, the first direction and the second direction are perpendicular to each other, and a maximum value of the third length is greater than a maximum value of the fourth length.

In at least one embodiment, the third length is from 0.1 mm to 0.7 mm, and the fourth length is from 0.1 mm to 0.4 mm.

In at least one embodiment, a part of the conductive portion extends outward from the through hole to cover the exposed portion of the relay contact pad.

In at least one embodiment, a difference between a maximum height of the conductive portion relative to the second substrate and a maximum height of the relay contact pad relative to the second substrate is greater than zero and smaller than or equal to 0.1 mm.

In at least one embodiment, the opening of the insulating layer serves as a coating area of a solder material, and the solder material coated in the coating area is configured to flow into a cavity formed by the connection portion and serve as the conductive portion.

In at least one embodiment, the second circuit board further comprises an adhesive layer provided on an outer surface of the second substrate, the adhesive layer is configured for adhering the second circuit board to the first circuit board, the second circuit board comprises a bonding region, the through hole is provided in the bonding region, and at least a part of the adhesive layer is provided in the bonding region of the second substrate.

In at least one embodiment, the adhesive layer has a hollow portion, and an orthographic projection of the through hole on the adhesive layer is provided in the hollow portion.

In at least one embodiment, the hollow portion comprises a central hollow portion and at least one extension hollow portion connected with the central hollow portion, and an orthographic projection of the through hole on the adhesive layer is provided in the central hollow portion.

In at least one embodiment, the connection portion comprises a first metal layer and a second metal layer, a metal activity of the second metal layer is lower than that of the first metal layer, and the second metal layer is closer to the conductive portion than the first metal layer.

In at least one embodiment, the display panel further comprises a bending area provided between the display area and the driving control circuit, the bending area is bendable along a bending axis, and a plurality of relay holes are provided on a side of the bending axis close to the display area for changing layers of the first touch-electrode wire and the second touch-electrode wire.

Another embodiment of the present disclosure provides a display device. The display device comprises a display panel and a flexible circuit board, and the display panel comprises a display area and a peripheral area;

In the display area, a plurality of sub-pixels provided in an array, and a plurality of scanning lines and a plurality of data lines intersecting each other are provided in the display area, the plurality of scanning lines extend along a first direction and the plurality of data lines extend along a second direction different from the first direction;

the peripheral area surrounds the display area, a plurality of first connection terminals, a plurality of second connection terminals, a plurality of third connection terminals, a plurality of fourth connection terminals, a plurality of fifth connection terminals and a driving control circuit are provided in the peripheral area on a first side of the display panel, the plurality of data lines are respectively electrically connected with the plurality of first connection terminals, the plurality of first connection terminals are spaced from the plurality of second connection terminals, the driving control circuit is electrically connected with the plurality of first connection terminals and the plurality of second connection terminals, the fifth connection terminals are respectively electrically connected with the second connection terminals through connection wires, a total number of the plurality of first connection terminals is larger than that of the plurality of fifth connection terminals, and the plurality of fifth connection terminals are closer to an edge of the first side of the display panel than the plurality of first connection terminals and the plurality of second connection terminals;

the flexible circuit board is electrically connected with the display panel, a side of the flexible circuit board is provided with a plurality of first wiring terminals, a plurality of second wiring terminals and a plurality of third wiring terminals, the plurality of first wiring terminals are respectively electrically connected with the plurality of third connection terminals, the plurality of second wiring terminals are respectively electrically connected with the plurality of fourth connection terminals, the plurality of third wiring terminals are respectively electrically connected with the plurality of fifth connection terminals, and the flexible circuit board comprises a first circuit board, a second circuit board, and a conductive portion:

the first circuit board comprises a first substrate, and a main contact pad, a first wire and a second wire provided on the first substrate, wherein the main contact pad comprises a first contact pad and a second contact pad, the first wire is electrically connected with the first contact pad, and the second wire is electrically connected with the second contact pad;

the second circuit board comprises a second substrate, and a relay contact pad and a third wire provided on the second substrate, wherein the relay contact pad comprises a third contact pad and a fourth contact pad, and the third contact pad and the fourth contact pad are connected with each other through the third wire;

the conductive portion is configured for electrically connecting the main contact pad and the relay contact pad, wherein the conductive portion comprises a first conductive portion and a second conductive portion;

herein, the first circuit board and the second circuit board are different from each other in shape, the second circuit board is stacked on the first circuit board so that the second circuit board is provided on a side of the first contact pad and the second contact pad away from the first substrate, the first contact pad and the third contact pad are electrically connected with each other through the first conductive portion, and the second contact pad and the fourth contact pad are electrically connected with each other through the second conductive portion;

herein, the display panel comprises a base substrate, the plurality of sub-pixels are provided on the base substrate, each sub-pixel comprises an organic electroluminescent element, a touch conductive layer is provided on the organic electroluminescent elements, a plurality of first touch electrodes and a plurality of second touch electrodes are provided in the touch conductive layer, the plurality of first touch electrodes constitute a first touch electrode line extending along the first direction, the plurality of second touch electrodes constitute a second touch electrode line extending along the second direction, the first touch electrode line and second touch electrode line intersect each other, first touch-electrode wires electrically connected with the first touch electrodes and second touch-electrode wires electrically connected with the second touch electrodes are provided in the peripheral area of the display panel, the first touch-electrode wires are electrically connected with the fourth connection terminals, and the second touch-electrode wires are electrically connected with the third connection terminals;

herein, a vertical distance between the touch conductive layer and a plane where the plurality of data lines are located is a first distance, the display panel further comprises a driving control line electrically connected with the driving control circuit through the third wiring terminal, the driving control line intersects the third wire in space, a vertical distance between the driving control line and the third wire is a second distance, and the first distance is different from the second distance; and herein, the first distance is smaller than the second distance.

In at least one embodiment, the first wire is connected with the first contact pad through a first transition connection portion, the second wire is connected with the second contact pad through a second transition connection portion, and the third wire is connected with the third contact pad and/or the fourth contact pad through a third transition connection portion; a width of the first transition connection portion is gradually reduced in a direction from the first contact pad to the first wire, a width of the second transition connection portion is gradually reduced in a direction from the second contact pad to the second wire, and a width of the third transition connection portion is gradually reduced in a direction from the third contact pad and/or the fourth contact pad to the third wire.

In at least one embodiment, the first circuit board comprises a plurality of first contact pads, a plurality of second contact pads, a plurality of first wires and a plurality of second wires; the plurality of the first contact pads are provided in an array, a first gap exists between two adjacent first contact pads, and at least one first wire of the plurality of first wires passes through the first gap and is connected with another first contact pad different from the two adjacent first contact pads; the plurality of second contact pads are provided in an array, a second gap exists between two adjacent second contact pads, and at least one second wire of the plurality of second wires passes through the second gap and is connected with another second contact pad different from the two adjacent second contact pads.

In at least one embodiment, the second circuit board comprises a plurality of third contact pads, a plurality of fourth contact pads and a plurality of third wires; the plurality of third contact pads are provided in an array, a third gap exists between two adjacent third contact pads, and at least one third wire of the plurality of third wires passes through the third gap and is connected with another third contact pad different from the two adjacent third contact pads; the plurality of the fourth contact pads are provided in an array, a fourth gap exists between two adjacent fourth contact pads, and at least one another third wire of the plurality of third wires passes through the fourth gap and is connected with another fourth contact pad different from the two adjacent fourth contact pads.

In at least one embodiment, a first connection line is drawn between center points of the two adjacent first contact pads, the at least one first wire forms an intersection point with the first connection line, and a difference between a distance between the center point of one of the two adjacent first contact pads and the intersection point and a distance between the center point of the other of the two adjacent first contact pads and the intersection point is smaller than or equal to a width of the at least one first wire; a second connection line is drawn between center points of the two adjacent second contact pads, the at least one second wire forms an intersection point with the second connection line, and a difference between a distance between the center point of one of the two adjacent second contact pads and the intersection point and a distance between the center point of the other of the two adjacent second contact pads and the intersection point is smaller than or equal to a width of the at least one second wire.

In at least one embodiment, a third connection line is drawn between center points of the two adjacent third contact pads, the at least one third wire forms an intersection point with the third connection line, and a difference between a distance between the center point of one of the two adjacent third contact pads and the intersection point and a distance between the center point of the other of the two adjacent third contact pads and the intersection point is smaller than or equal to a width of the at least one third wire.

Still another embodiment of the present disclosure provides a manufacturing method of a display device, comprising:

providing a display panel, the display panel comprising:
a display area, herein, a plurality of sub-pixels provided in an array, and a plurality of scanning lines and a plurality of data lines intersecting each other are provided in the display area, the plurality of scanning lines extend along a first direction and the plurality of data lines extend along a second direction different from the first direction; and a peripheral area surrounding the display area, herein, a plurality of first connection terminals, a plurality of second connection terminals, a plurality of third connection terminals, a plurality of fourth connection terminals, a plurality of fifth connection terminals and a driving control circuit are provided in the peripheral area on a first side of the display panel, the plurality of data lines are respectively electrically connected with the plurality of first connection terminals, the plurality of first connection terminals are spaced from the plurality of second connection terminals, the driving control circuit is electrically connected with the plurality of first connection terminals and the plurality of second connection terminals, the fifth connection terminals are respectively electrically connected with the second connection terminals through connection wires, a total number of the plurality of first connection terminals is larger than that of the plurality of fifth connection terminals, and the plurality of fifth connection terminals are closer to an edge of the first side of the display panel than the plurality of first connection terminals and the plurality of second connection terminals; and forming a flexible circuit board, the flexible circuit board being configured for electrically connected with the display panel, herein, a side of the flexible circuit board is provided with a plurality of first wiring terminals, a plurality of second wiring terminals and a plurality of third wiring terminals, the plurality of first wiring terminals are respectively electrically connected with the plurality of third connection terminals, the plurality of second wiring terminals are respectively electrically connected with the plurality of fourth connection terminals, the plurality of third wiring terminals are respectively electrically connected with the plurality of fifth connection terminals, the forming the flexible circuit board comprises:

providing a first circuit board, the first circuit board comprising a first substrate, and a main contact pad, a first wire and a second wire provided on the first substrate, wherein the main contact pad comprises a first contact pad and a second contact pad, the first wire is electrically connected with the first contact pad, and the second wire is electrically connected with the second contact pad;

providing a second circuit board, the second circuit board comprising a second substrate, and a relay contact pad and a third wire provided on the second substrate, wherein the relay contact pad comprises a third contact pad and a fourth contact pad, and the third wire electrically connects the third contact pad and the fourth contact pad with each other;

stacking the second circuit board on the first circuit board so that the second circuit board is provided on a side of the first contact pad and the second contact pad away from the first substrate, wherein the first circuit board and the second circuit board are different from each other in shape; and electrically connecting the main contact pad and the relay contact pad by a conductive portion, wherein the conductive portion comprises a first conductive portion and a second conductive portion, the first contact pad and the third contact pad are electrically connected with each other through the first conductive portion, and the second contact pad and the fourth contact pad are electrically connected with each other through the second conductive portion.

In at least some embodiments, before the stacking the second circuit board on the first circuit board, the manufacturing method further comprises: coating a soldering material on the third contact pad and the fourth contact pad of the second circuit board.

In at least some embodiments, before the stacking the second circuit board on the first circuit board, the manufacturing method further comprises: coating a soldering material on the first contact pad and the second contact pad of the first circuit board; and coating the soldering material on the third contact pad and the fourth contact pad of the second circuit board.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 24:
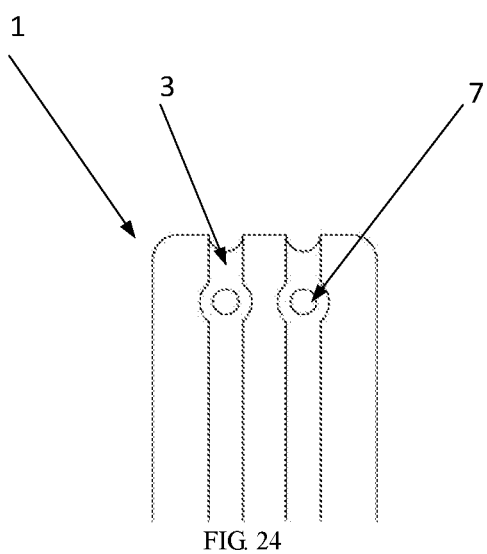
FIG. 24 is a structural schematic view of gold fingers provided on a flexible circuit board of the present disclosure.

FIG. 24 is a structural schematic view of gold fingers provided on a flexible circuit board of the present disclosure. As shown in FIG. 24, the flexible circuit board (which is abbreviated as FPC) 1 comprises a plurality of gold fingers 3 provided at a soldering end, which is to be connected with a display panel, of the flexible circuit board 1. A width of each gold finger (also referred as gold finger line) 3 is equal to a width of a gap between adjacent gold fingers 3; and through holes 7, that are staggered from each other, are respectively provided on adjacent gold fingers 3. These golden fingers 3 occupy a relatively large area of the flexible circuit board 1. Furthermore, a plurality of soldering channels formed by the golden fingers 3 are provided on a same surface of the flexible circuit board (i.e., the flexible circuit board is a single-sided FPC), so that the space utilization rate of the flexible circuit board is low.

Figure 25:
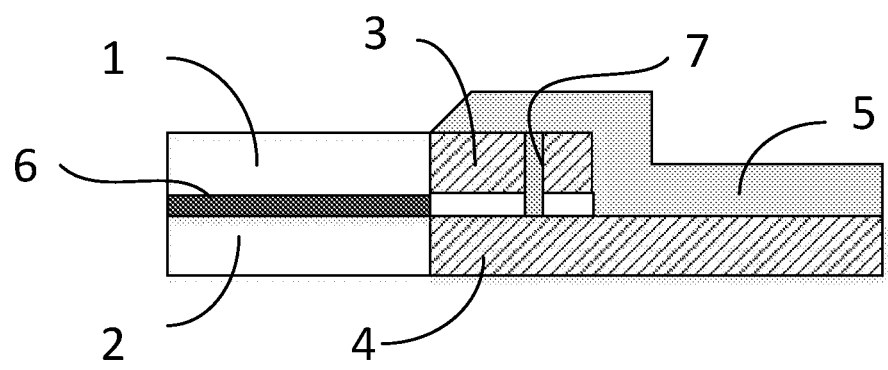
FIG. 25 is a schematic cross-sectional view of two flexible circuit board connected with each other.

FIG. 25 is a schematic cross-sectional view of two flexible circuit boards connected with each other. As shown in FIG. 25, the gold finger 3 of the flexible circuit board 1 and the gold finger 4 of the flexible circuit board 2 are connected with each other by a conductive material (e.g., solder paste 5). In order to enhance the connection strength between the two flexible circuit boards 1 and 2, a plurality of through holes 7 staggered from each other are respectively provided on adjacent gold fingers 4, and the solder paste 5 flows into each through hole 7. An adhesive (e.g., adhesive tape 6) is further provided between the two flexible circuit boards 1 and 2 to strengthen the connection strength between the two flexible circuit boards 1 and 2 (the blank region between the golden fingers 3 and 4 in FIG. 25 only indicates that there is no other layer or material between them, and the golden fingers 3 and 4 are adjacent to or in contact with each other in the actual product). However, the solder paste 5 is easy to break at the joint of the two flexible circuit board 1 and 2, the soldering area is large and the total number of the soldering channels is limited. In addition, the process of applying the solder paste 5 on the two gold fingers 3, 4 requires manual operation (for example, a manual soldering by using a soldering rod to brush the solder paste onto the two gold fingers 3, 4), so that the connection between the two flexible circuit boards cannot be realized by automatic process.

To solve at least one of the above problems, embodiments of the present disclosure provide a display device and a manufacturing method thereof.

Embodiments of the present disclosure provide a display device, the display device comprises a display panel, and the display panel comprises a display area and a peripheral area surrounding the display area. The display area is provided with a plurality of sub-pixels arranged in an array, a plurality of scanning lines and a plurality of data lines interacting each other; the plurality of scanning lines extend along a first direction, and the plurality of data lines extend along a second direction different from the first direction. A plurality of first connection terminals, a plurality of second connection terminals, a plurality of third connection terminals, a plurality of fourth connection terminals, a plurality of fifth connection terminals and a driving control circuit are provided in the peripheral area on a first side of the display panel. The plurality of the data lines are electrically connected with the plurality of first connection terminals, respectively. The plurality of the first connection terminals are spaced from the plurality of the second connection terminals. The driving control circuit is electrically connected with the plurality of first connection terminals and the plurality of second connection terminals. The plurality of fifth connection terminals are electrically connected with the plurality of second connection terminals through connection wires, respectively. The total number of the plurality of first connection terminals is larger than that of the plurality of fifth connection terminals, and the plurality of fifth connection terminals are closer to an edge of the first side of the display panel than the plurality of first connection terminals and the plurality of second connection terminals.

The display device according to the embodiments of the disclosure further comprises a flexible circuit board electrically connected with the display panel. A side of the flexible circuit board is provided with a plurality of first wiring terminals, a plurality of second wiring terminals and a plurality of third wiring terminals. The plurality of first wiring terminals are electrically connected with the plurality of third connection terminals, respectively; the plurality of second wiring terminals are electrically connected with the plurality of fourth connection terminals, respectively; and the plurality of third wiring terminals are electrically connected with the plurality of fifth connection terminals, respectively. The flexible circuit board comprises a first circuit board and a second circuit board. The first circuit board comprises a first substrate, and a main contact pad, a first wire and a second wire provided on the first substrate. The main contact pad comprises a first contact pad and a second contact pad, the first wire is electrically connected with the first contact pad and the second wire is electrically connected with the second contact pad. The second circuit board comprises a second substrate, and a relay contact pad and a third wire provided on the second substrate. The relay contact pad comprises a third contact pad and a fourth contact pad, and the third wire is electrically connected with the third contact pad and the fourth contact pad, respectively.

The display device according to the embodiments of the disclosure further comprises a conductive portion for electrically connecting the main contact pad and the relay contact pad. The conductive portion comprises a first conductive portion and a second conductive portion. The second circuit board is stacked on the first circuit board, so that the second circuit board is provided on a side of the first contact pad and the second contact pad away from the first substrate. The first contact pad and the third contact pad are electrically connected with each other through the first conductive portion, and the second contact pad and the fourth contact pad are electrically connected with each other through the second conductive portion.

In the display device according to the embodiments of the disclosure, by providing the main contact pad on the first circuit board and the relay contact pad on the second circuit board, the first and second wires of the first circuit board are respectively connected with two ends of the third wire of the second circuit board through the conductive portion of the display device. Compared with the conventional display device, the display device according to the embodiments of the disclosure can reduce density of the wires and the total number of layers for providing the wires of the flexible circuit board, prevent the interference between the wires, and improve the defect-free ratio of the wires.

Types of the display device according to the embodiments of the present disclosure may comprise various types, such as liquid crystal display device, organic light emitting diode (OLED) display device, electrophoretic display device, cathode ray tube (CRT) device, and the like. The display device comprises, but is not limited to, notebook computer, desktop computer, tablet computer, mobile phone, digital photo frame, e-book, mini-projector, navigator, digital television, mobile television, billboard and other products with display function.

The display device according to the embodiments of the present disclosure will be described in detail below by taking the case that the display device is a touch display device as an example.

Figure 1:
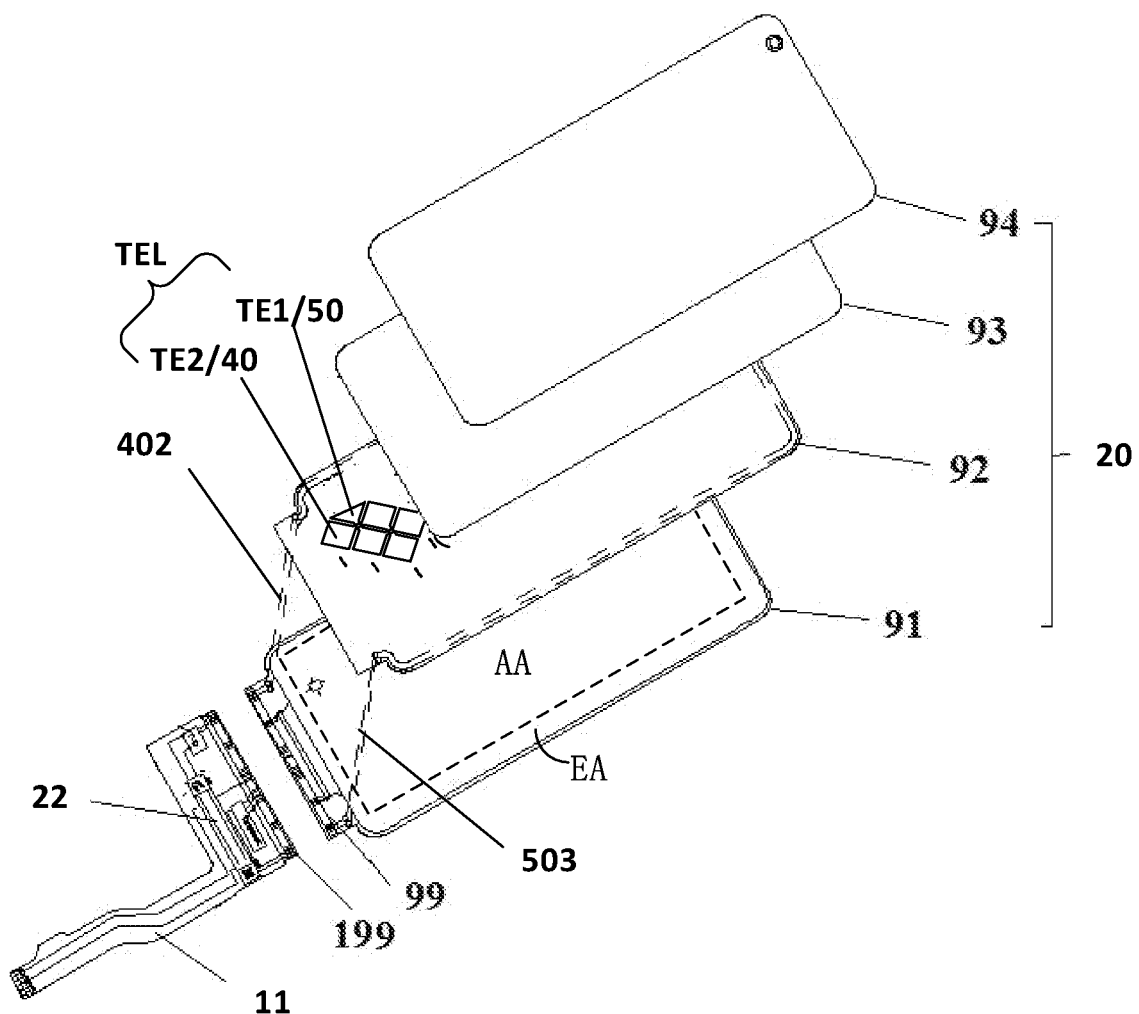
FIG. 1 is an exploded schematic structural view of a touch display device according to an embodiment of the present disclosure.
Figure 2:
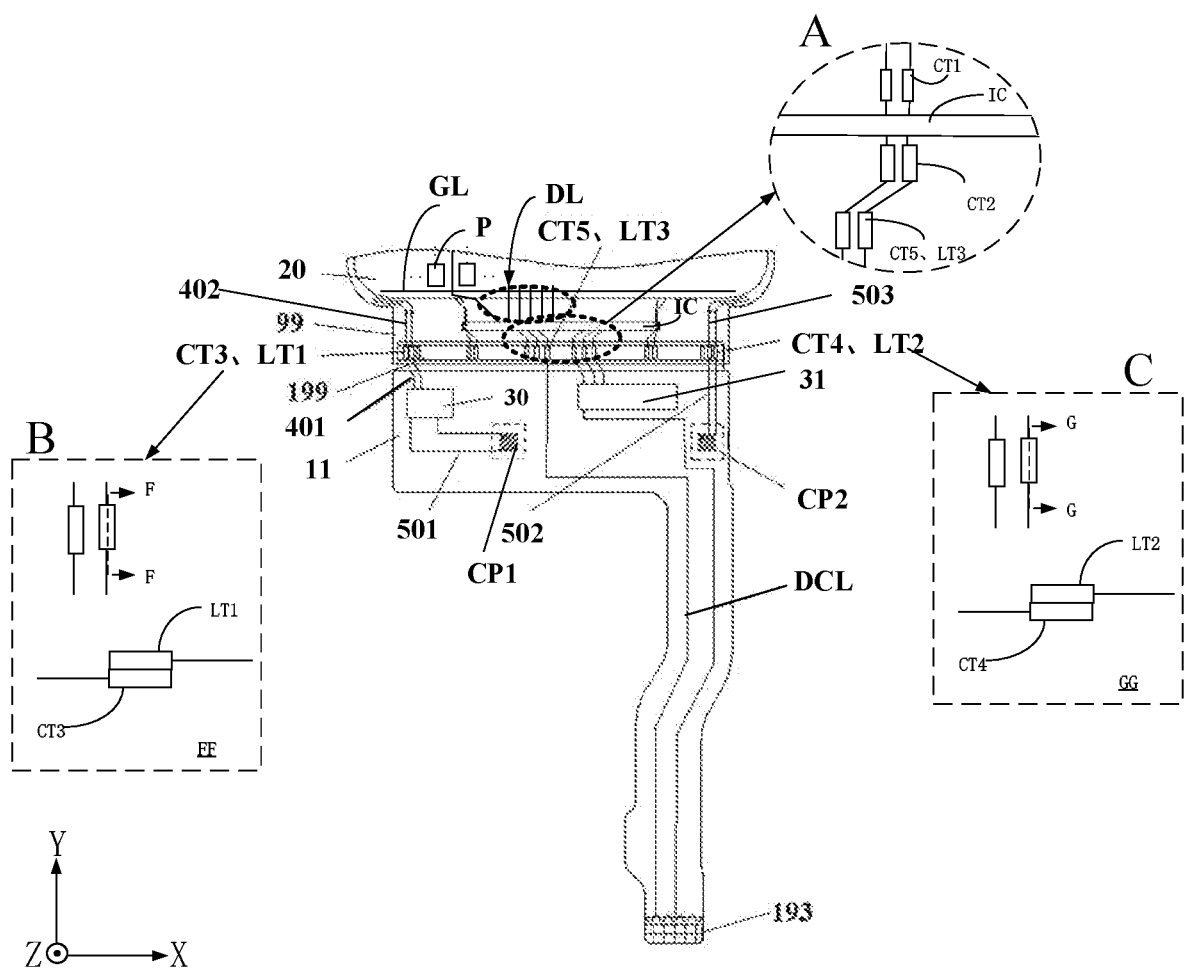
FIG. 2 is a partial schematic structural view of a touch display device according to an embodiment of the present disclosure after removing a second circuit board.
Figure 3A:
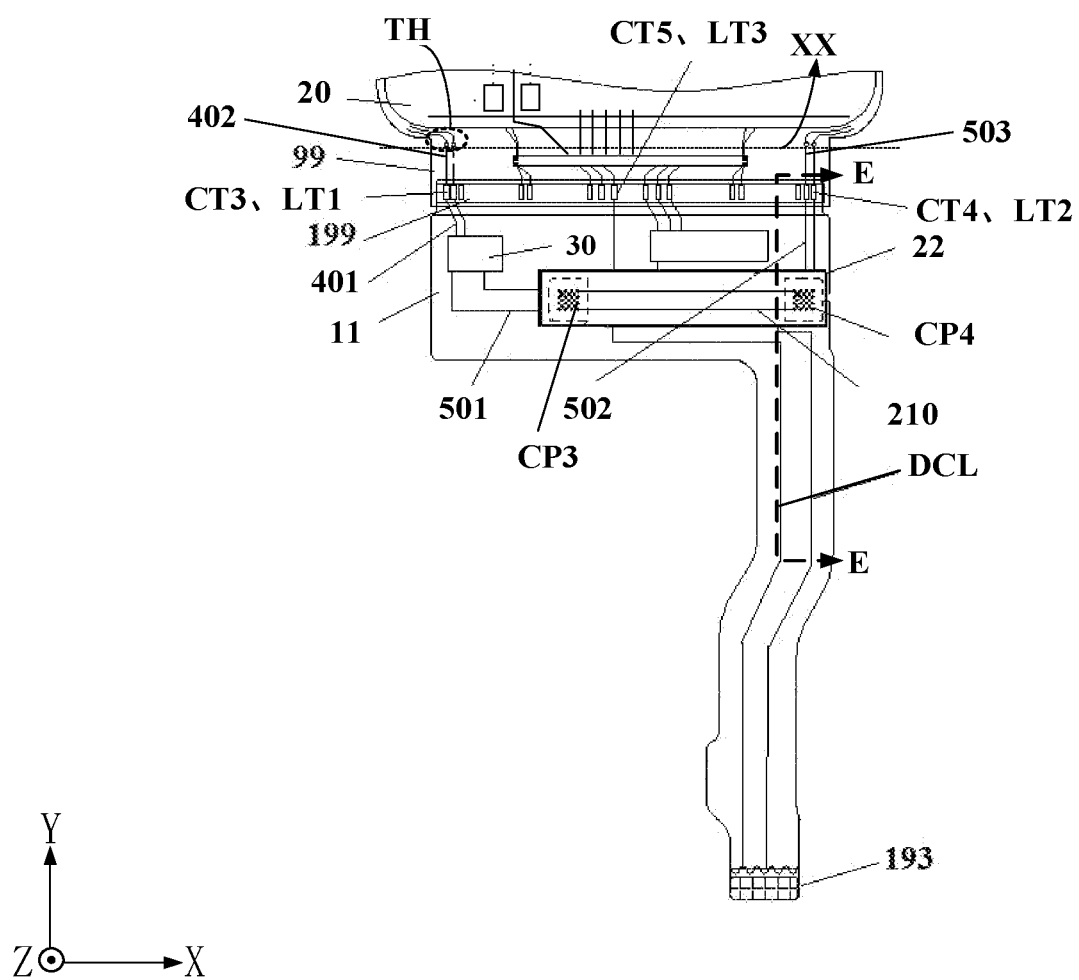
FIG. 3A is a partial schematic structural view of a touch display device according to an embodiment of the present disclosure.

FIG. 1 is an exploded schematic structural view of a touch display device according to an embodiment of the present disclosure (after a first circuit board and a second circuit board are connected with each other). FIG. 2 is a partial schematic structural top view of the touch display device according to an embodiment of the present disclosure after removing the second circuit board. FIG. 3A is a partial schematic structural view of the touch display device according to an embodiment of the present disclosure.

For example, referring to FIGS. 1, 2 and 3A, the touch display device according to the embodiments of the present disclosure comprises a display panel 20. The display panel 20 comprises a base substrate, and a display structure 91 provided on the base substrate. The display panel 20 further comprises a touch structure 92, a polarizer 93 and a cover plate 94, all of which are provided on a side of the display structure 91 away from the base substrate. The display panel 20 is used to display images. As shown in FIG. 1, the display panel comprises a display area AA and a peripheral area EA surrounding the display area AA. As shown in FIG. 1 and FIG. 2, a plurality of sub-pixels P arranged in an array are provided in the display area AA. A plurality of scanning lines GL extending along a first direction (e.g., X direction shown in the drawing) and a plurality of data lines DL extending along a second direction (e.g., Y direction shown in the drawing) different from the first direction are also provided in the display area AA.

For example, as shown in FIG. 1, FIG. 2 and FIG. 3A, the peripheral area EA is provided with a connection end 99 on a first side (e.g., the lower side as shown in the drawing) of the display panel. Further, for example, the connection end 99 comprises a plurality of first connection terminals CT1, a plurality of second connection terminals CT2, a plurality of third connection terminals CT3, a plurality of fourth connection terminals CT4, a plurality of fifth connection terminals CT5 and a driving control circuit IC. The plurality of data lines DL are electrically connected with the plurality of first connection terminals CT1, respectively. As shown in the dashed box A in FIG. 2, the plurality of first connection terminals CT1 are spaced from the plurality of second connection terminals CT2, and the driving control circuit IC is electrically connected with the plurality of first connection terminals CT1 and the plurality of second connection terminals CT2. The plurality of fifth connection terminals CT5 are electrically connected with the plurality of second connection terminals CT2 by connection wires, respectively. The total number of the first connection terminals CT1 is larger than that of the fifth connection terminals CT5, and the fifth connection terminals CT5 are closer to the edge of the lower side of the display panel 20 than the first connection terminals CT1 and the second connection terminals CT2. For example, the above-mentioned "electrical connection" may be realized by direct contact.

For example, as shown in FIG. 1, FIG. 2 and FIG. 3A, the touch display device according to the embodiments of the present disclosure further comprises a flexible circuit board electrically connected with the display panel 20, and a side (for example, the upper side shown in the drawing) of the flexible circuit board is provided with a wiring end 199 electrically connected with the connection end 99 of the display panel 20. For example, the wiring end 199 comprises a plurality of first wiring terminals LT1, a plurality of second wiring terminals LT2, and a plurality of third wiring terminals LT3. As shown in the dashed box B of FIG. 2, in the cross-sectional view FF, the first wiring terminal LT1 is electrically connected with the third connection terminal CT3. As shown in the dashed box C of FIG. 2, in the cross-sectional view GG, the second wiring terminal LT2 is electrically connected with the fourth connection terminal CT4. As shown in the dashed box A of FIG. 2, the third wiring terminal LT3 is electrically connected with the fifth connection terminal CT5, and the connection manner between the fifth connection terminal CT5 and the third wiring terminal LT3 is the same as that between the third connection terminal CT3 and the first wiring terminal LT1, which is not depicted specifically here.

Figure 4:
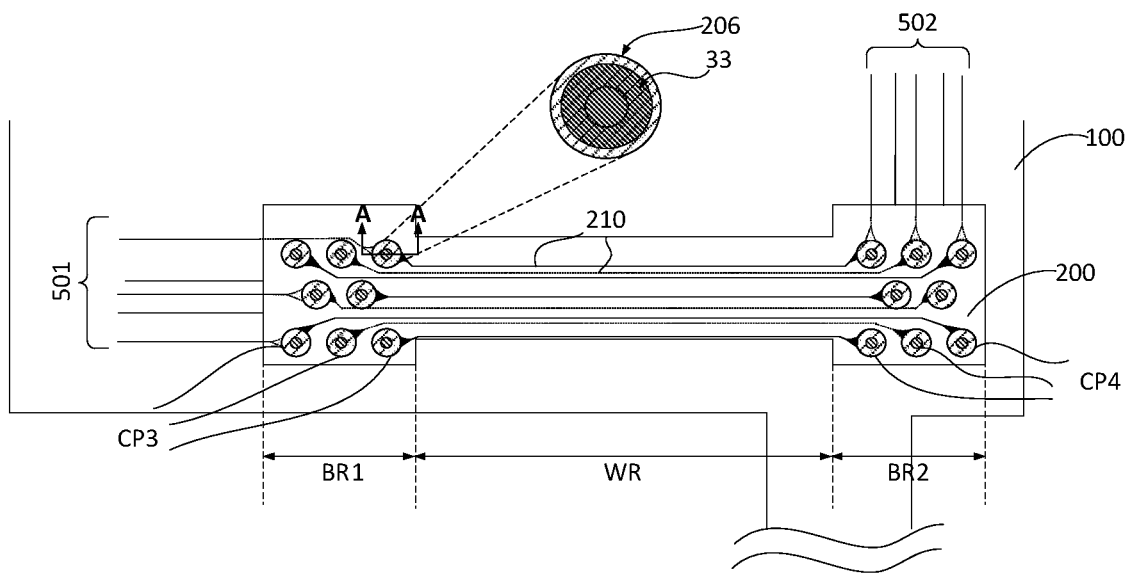
FIG. 4 is a partial enlarged schematic structural view of a touch display device according to an embodiment of the present disclosure.
Figure 5A:
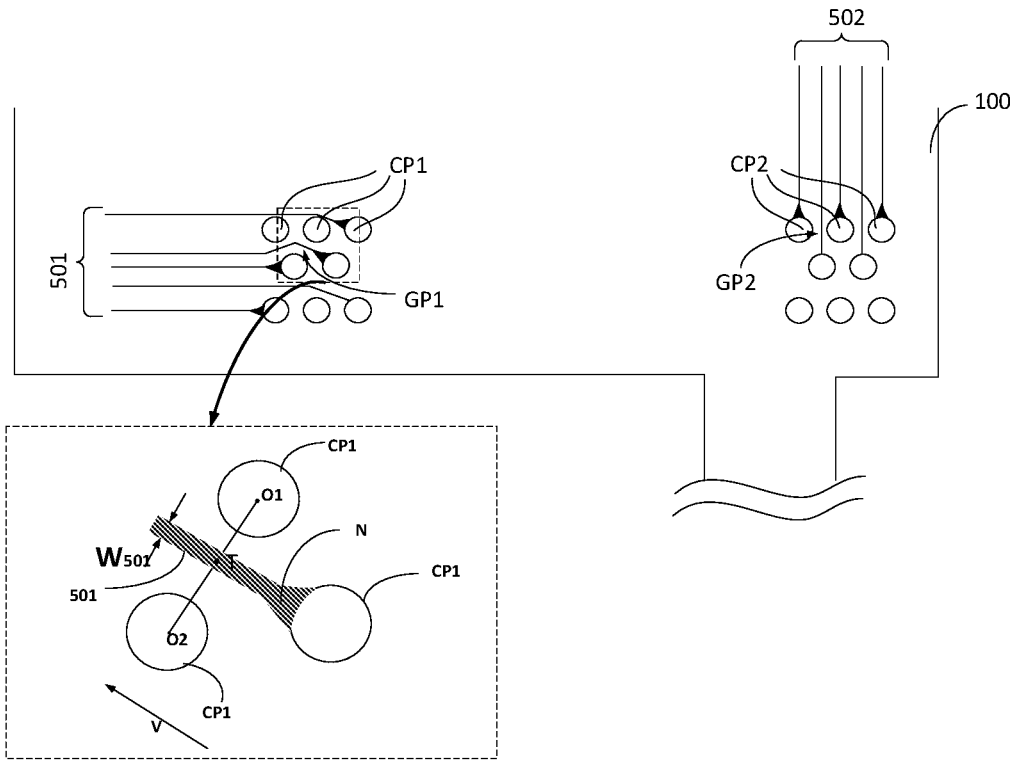
FIG. 5A is a schematic structural view of a first circuit board according to an embodiment of the present disclosure.
Figure 5B:
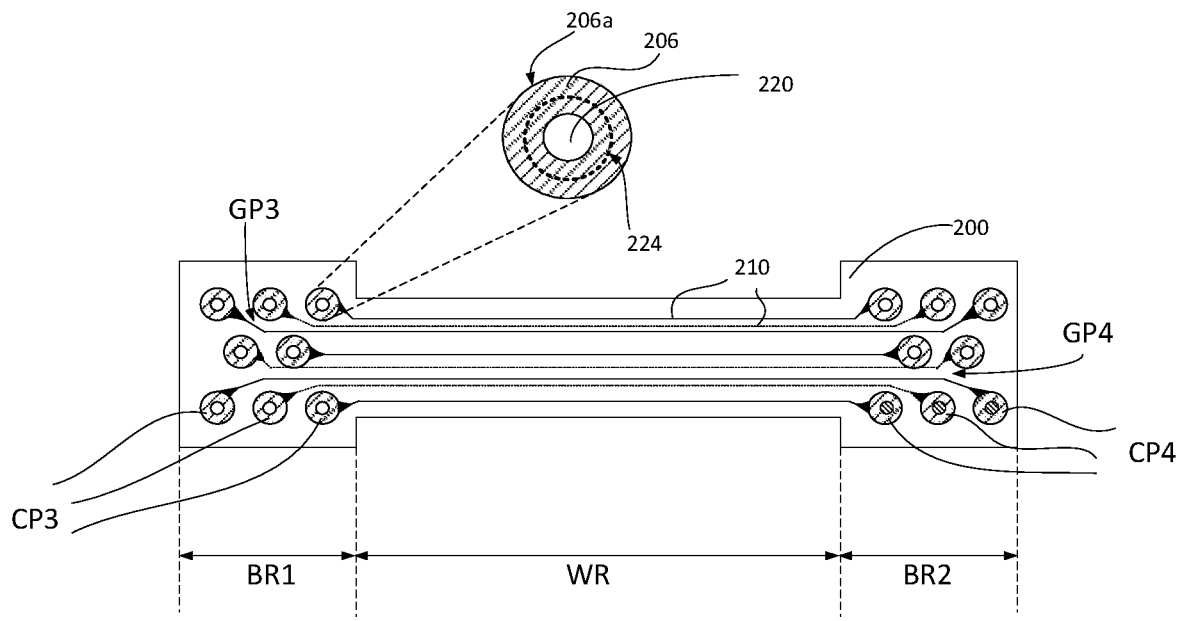
FIG. 5B is a schematic structural view of a second circuit board according to an embodiment of the present disclosure.
Figure 6:
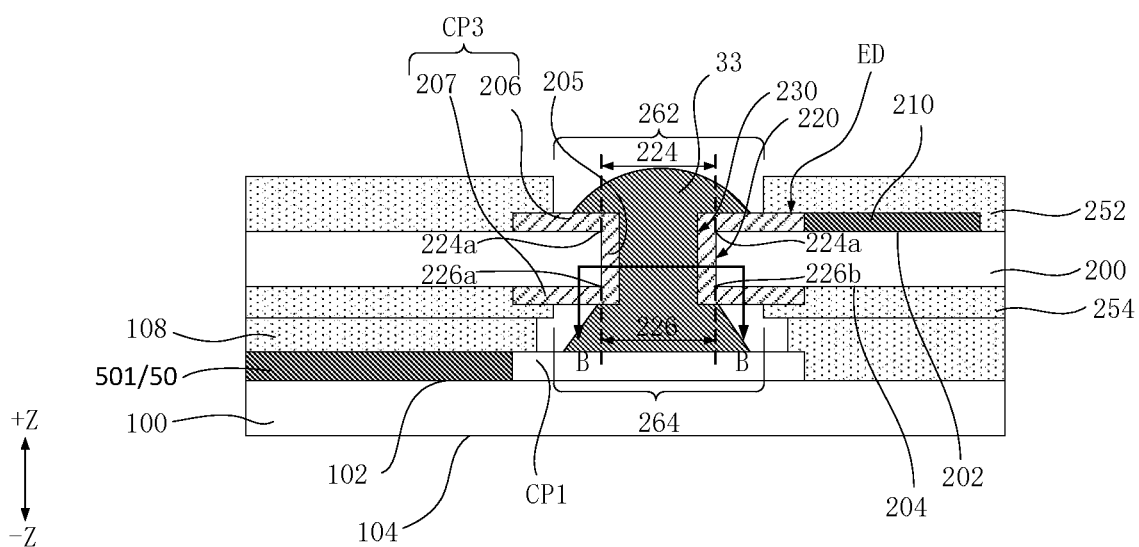
FIG. 6 is a schematic cross-sectional view of the display device according to the embodiment of the present disclosure taken along the line A-A in FIG. 4.

For example, as shown in FIGS. 2 and 3A, the flexible circuit board comprises a first circuit board 11 and a second circuit board 22. FIG. 4 is a partial enlarged schematic structural view of a touch display device according to an embodiment of the present disclosure. FIG. 5A is a schematic structural view of a first circuit board according to an embodiment of the present disclosure. FIG. 5B is a schematic structural view of a second circuit board according to an embodiment of the present disclosure. FIG. 6 is a schematic cross-sectional view of a display device according to an embodiment of the present disclosure taken along the line A-A in FIG. 4.

For example, as shown in FIG. 2, FIG. 3A, FIG. 4 and FIG. 5A, the first circuit board 11 comprises a first substrate 100, and the first circuit board 11 further comprises a main contact pad, a first wire 501 and a second wire 502, all of which are provided on the first substrate 100. The main contact pad comprises a first contact pad CP1 and a second contact pad CP2, the first wire is electrically connected with the first contact pad CP1 and the second wire is electrically connected with the second contact pad CP2. As shown in FIG. 2, FIG. 3A, FIG. 4 and FIG. 5B, the second circuit board 22 comprises a second substrate 200, and the second circuit board 22 further comprises a relay contact pad and a third wire 210 which are provided on the second substrate 200. The relay contact pad comprises a third contact pad CP3 and a fourth contact pad CP4, and the third wire is electrically connected with the third contact pad CP3 and the fourth contact pad CP4, respectively.

For example, as shown in FIG. 6, the flexible circuit board further comprises a conductive portion for electrically connecting the main contact pad on the first circuit board 11 and the relay contact pad on the second circuit board 22. Further, for example, the conductive portion comprises a first conductive portion 33 and a second conductive portion (not shown in the drawing). For example, the shape of the first circuit board 11 is different from that of the second circuit board 22. In at least one example, as shown in FIGS. 2 and 3A, the first circuit board 11 has an irregular shape, and the second circuit board 22 has a strip shape, so that they are different from each other in shape. In this way, it is convenient for the second circuit board 22 to bridge the signal lines on the first circuit board 11. The second circuit board 22 is stacked on the first circuit board 11, so that the second circuit board 22 is provided on a side of the first contact pad CP1 and the second contact pad CP2 away from the first substrate 100, and the first contact pad CP1 and the third contact pad CP3 are electrically connected with each other through the first conductive portion 33. The second contact pad CP2 and the fourth contact pad CP4 are electrically connected with each other through the second conductive portion. It should be noted that the second contact pad CP2 has the same structure as the first contact pad CP1, the fourth contact pad CP4 has the same structure as the third contact pad CP3, and the second conductive portion has the same structure as the first conductive portion 33, and thus, the second contact pad CP2, the fourth contact pad CP4 and the second conductive portion are not shown in the drawings, but their specific structures may refer to FIG. 6.

In the display device according to the embodiments of the disclosure, the first contact pad CP1 and the second contact pad CP2 are provided on the first circuit board 11, and the third contact pad CP3 and the fourth contact pad CP4 are provided on the second circuit board 22, so that the first wire 501 of the first circuit board 11 and a first end (left end shown in the drawing) of the third wire 210 of the second circuit board 22 are electrically connected with each other through the first conductive portion, and the second wire 502 of the first circuit board 11 and a second end (right end shown in the drawing) of the third wire 210 of the second circuit board 22 are electrically connected with each other through the second conductive portion. In the touch display device according to the embodiments of the present disclosure, there are a plurality of signal lines that need to be led out from the display panel to the flexible circuit board, and the signal lines are long. In order to avoid the possible interference of these signal lines during routing and reduce the difficulty of routing design, the second circuit board 22 is used as a relay of the signal lines, thereby shortening the routing distance between the driving signal lines and the touch chip and reducing the difficulty of routing design. Compared with the conventional display device, the display device according to the embodiments of the disclosure can reduce density of the wires and the total number of layers for providing the wires of the flexible circuit board, prevent the interference between the wires, and improve the defect-free ratio of the wires.

In the embodiments of the disclosure, the expression "the second circuit board 22 is stacked on the first circuit board 11" means that there is an overlapping region between the first circuit board and the second circuit board in a direction perpendicular to a plane where the circuit board (the first circuit board or the second circuit board) is provided, which may comprises a case that the first circuit board and the second circuit board are partially overlapped or a case that the first circuit board and the second circuit board are completely overlapped. The drawing exemplarily shows that the second circuit board 22 and the first circuit board 11 are completely overlapped in the direction perpendicular to the plane where the circuit board (the first circuit board 11 or the second circuit board 22) is provided. That is, an orthographic projection of the second circuit board 22 on the first circuit board 11 is within the first circuit board 11. It can be understood that there may be other stacking modes between the two circuit boards, which may be determined according to the actual needs of products and is not limited by the embodiments of the disclosure. In the embodiments of the present disclosure, the display panel for example is a display panel provided with a Chip On Film (COF), and the side of the display panel for example is the side of COF. That is, the side of COF is provided with the connection end electrically connected with the flexible circuit board, which is not limited by the embodiments of the disclosure. In the embodiments of the present disclosure, the plurality of fifth connection terminals on the display panel 20 for example are connected with different wires. For example, as shown in FIG. 2, the touch display device further comprises an element 31, part of the fifth connection terminals are connected with the wires for electrically connecting with the element 31, and the other part of the fifth connection terminals are connected with driving control lines DCL. The DCL is connected with an end 193 of the flexible circuit board.

In some embodiments, a maximum width of the display area is greater than a maximum width of the flexible circuit board. For example, as shown in FIGS. 1 and 3A, the maximum width of the display area AA in the first direction (e.g., the X direction shown in the drawing) is larger than the maximum width of the flexible circuit board in the first direction. In this way, the space of the display device occupied by the flexible circuit board and the wires of the flexible circuit board can be reduced. In the embodiments of the present disclosure, if the width of the display area in the X direction is constant, the width is the maximum width of the display area. For example, as shown in FIG. 1, the display area AA is a rectangle with chamfers, and the width of the display area AA in the X direction is constant and thus is the maximum width of the display area. If the width of the display area in the X direction changes, the maximum size in the X direction is taken as the maximum width. At this time, the display area may be round, oval or irregularly-shaped.

For example, as shown in FIGS. 1 and 2, the display panel comprises a base substrate, and the plurality of the sub-pixels P are provided on the base substrate. Each sub-pixel P comprises an organic electroluminescent element, and a touch conductive layer TEL is provided on a plurality of the organic electroluminescent elements. As shown in FIG. 1, a plurality of first touch electrodes TE1 and a plurality of second touch electrodes TE2 are provided in the touch conductive layer TEL. As shown in FIG. 2, the plurality of first touch electrodes TE1 constitute a first touch electrode line 50 extending along the first direction, and the plurality of second touch electrodes TE2 constitute a second touch electrode line 40 extending along the second direction. The first touch electrode line 50 and the second touch electrode line 40 intersects each other, so that a touch capacitance is formed at the intersection position of the first touch electrode line and the second touch electrode line. The touch position is detected by detecting the change of the touch capacitance, caused by for example the proximity of use's finger during touch. For example, one of the first touch electrode TE1 and the second touch electrode TE2 is a touch driving electrode and the other is a touch sensing electrode. In the embodiments of the disclosure, the first touch electrode TE1 is used as the touch driving electrode, and the second touch electrode TE2 is used as the touch sensing electrode.

As shown in FIGS. 1, 2 and 3A, first touch-electrode wires 503 electrically connected with the first touch electrodes TE1 and second touch-electrode wires 402 electrically connected with the second touch electrodes TE2 are provided in the peripheral area EA of the display panel. As shown in FIG. 2 and FIG. 3A, the display device further comprises a touch chip 30 for providing a touch signal to the touch structure or receiving a sensing signal from the touch structure through the first touch electrode line 50 and the second touch electrode line 40.

For example, one end of the first wire 501 is connected with the touch chip 30, and the other end of the first wire 501 is electrically connected with one end of the third wire 210 through the third contact pad CP3. The other end of the third wire 210 is electrically connected with the second wire 502 through the fourth contact pad CP4. The second wire 502 is electrically connected with the first touch-electrode wire 503 through the second wiring terminal LT2 and the fourth connection terminal CT4. Finally, the touch chip 30 is electrically connected with the first touch electrode line 50, so that the first touch electrode line 50 can receive signals from or transmit signals to the touch chip 30.

For example, one end of a sensing signal line 401 is electrically connected with the touch chip 30, and the other end of the sensing signal line 401 is electrically connected with the second touch-electrode wire 402 through the first wiring terminal LT1 and the third connection terminal CT3. Finally, the touch chip 30 is electrically connected with the second touch electrode line 40, so that the second touch electrode line 40 can receive signals from or transmit signals to the touch chip 30. It can be understood that, besides the touch-electrode lines, other signal lines such as common voltage line and gate driving voltage line are also provided in the touch display device. According to actual product requirements, the second circuit board may be configured to electrically connect other signal lines in the touch display device, such as the common voltage line or the gate driving voltage line, and connect these signal lines to their corresponding driving chips.

Figure 20:
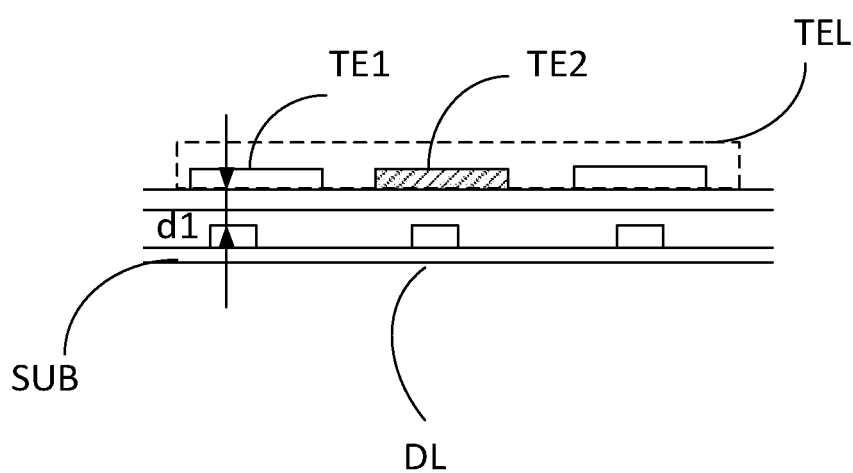
FIG. 20 is a schematic cross-sectional view of a data line and a touch electrode layer according to an embodiment of the present disclosure.
Figure 21:
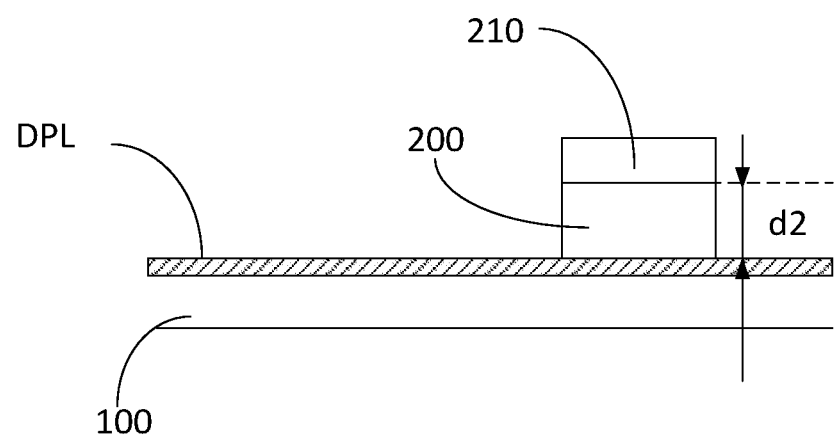
FIG. 21 is a schematic cross-sectional view of a driving control line and a third wire according to an embodiment of the present disclosure.

FIG. 20 is a schematic cross-sectional view of a data line and a touch electrode layer according to an embodiment of the present disclosure. For example, as shown in FIG. 20, a vertical distance between the touch conductive layer TEL and a plane where the plurality of data lines DL are located is a first distance d1. FIG. 21 is a schematic cross-sectional view of a driving control line and a third wire according to an embodiment of the present disclosure. As shown in FIG. 21. The first circuit board further comprises the driving control line DCL, which is electrically connected with the driving control circuit IC through the third wiring terminal LT3. The driving control line DCL intersects the third wire LT3 in space, and a vertical distance between the driving control line DCL and the third wire (for example, the third wire 210) is a second distance d2, and the first distance d1 is different from the second distance d2. For example, in at least one example, the first distance d1 is smaller than the second distance d2. For example, a distance between the touch conductive layer TEL and the base substrate SUB is larger than a distance between the third connection terminal CT3 and the base substrate SUB. It should be noted that in FIG. 20, a relay electrode, the organic electroluminescent element, an encapsulation layer and other related layers may be provided between the data line DL and the touch conductive layer; in order to avoid confusion, these structures or layers are not shown in FIG. 20.

For example, as shown in FIG. 3A, the display panel further comprises a bending area provided between the display area AA and the driving control circuit IC, and the bending area is bendable along a bending axis XX, and a plurality of relay holes TH are provided on a side of the bending axis XX close to the display area AA for changing layers of the first touch-electrode wire 503 and the second touch-electrode wire 502. By changing the layers of the first touch-electrode wire 503 and the second touch-electrode wire 502, not only the thickness of the conductive layers in the bending area can be reduced to avoid the influence of bending on signal transmission, but also the safety of signal lines and space utilization rate can be improved.

In some embodiments, as shown in FIG. 5A, the first circuit board 11 comprises a plurality of first contact pads CP1, a plurality of second contact pads CP2, a plurality of first wires 501 and a plurality of second wires 502. The plurality of first contact pads CP1 are provided in an array, and a first gap GP1 exists between two adjacent first contact pads CP1. At least one first wire of the plurality of first wires 501 passes through the first gap GP1 and is connected with another first contact pad different from the two adjacent first contact pads CP1. As shown in FIG. 5A, the plurality of second contact pads CP2 are provided in an array, a second gap GP2 exists between two adjacent second contact pads CP2, and at least one second wire of the plurality of second wires 502 passes through the second gap GP2 and is connected with another second contact pad different from the two adjacent second contact pads CP2. In this way, the soldering area of the two circuit boards can be reduced and the area of soldering region on each circuit board can be reduced, and the space utilization rate of the circuit boards can be improved. Moreover, it is beneficial to realize the full-automatic production of FPC by using surface mount technology (SMT), which improves the soldering efficiency of existing products and improves the production efficiency.

In some embodiments, as shown in FIG. 5B, the second circuit board 22 comprises a plurality of third contact pads CP3, a plurality of fourth contact pads CP4 and a plurality of third wires 210. The plurality of the third contact pads CP3 are provided in an array, and a third gap GP3 exists between two adjacent third contact pads CP3. At least one third wire of the plurality of third wires 201 passes through the third gap GP3 and is connected with another third contact pad different from the two adjacent third contact pads CP3. The plurality of the fourth contact pads CP4 are provided in an array, a fourth gap exists between two adjacent fourth contact pads CP4, and at least one third wire of the plurality of third wires 210 passes through the fourth gap GP4 and is connected with another fourth contact pad different from the two adjacent fourth contact pads CP4. In the embodiments, the at least one third wire connected with the another third contact pad CP3 and the at least one other third wire connected with the another fourth contact pad CP4 may be the same third wire or different third wires, which is not limited by the embodiments of the present disclosure.

Figure 5C:
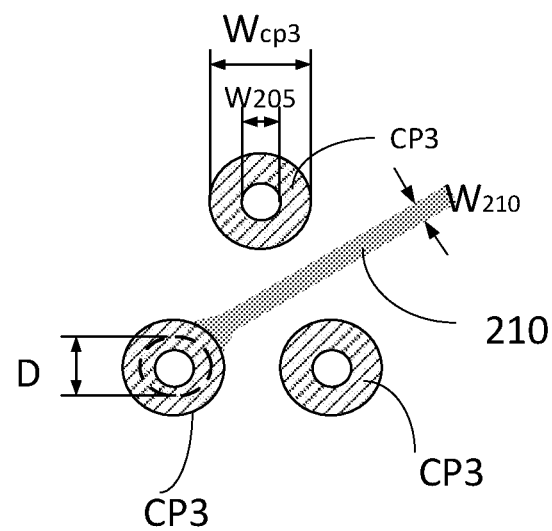
FIG. 5C is a schematic structural view of a third contact pad of a second circuit board according to an embodiment of the present disclosure.

FIG. 5C is a schematic structural view of a third contact pad of a second circuit board according to an embodiment of the present disclosure. It can be seen from FIG. 5C that one of the third wires 210 passes through the gap between two adjacent third contact pads CP3 and is connected with another third contact pad different from the two adjacent third contact pads CP3. In this way, the soldering area of the two circuit boards can be reduced and the space utilization rate of the circuit boards can be improved. Moreover, it is beneficial to realize the full-automatic production of FPC by using surface mount technology (SMT), which improves the soldering efficiency of existing products and improves the production efficiency.

Further, in at least one example, for the first contact pads, the second contact pads, the third contact pads or the fourth contact pads, a connection line is drawn between center points of the two adjacent contact pads, and the at least one wire (for example, the first wire, the second wire or the third wire) intersects the connection line to form an intersection point. A difference between a distance from a center point of one of the two adjacent contact pads to the intersection point and a distance from a center point of the other of the two adjacent contact pads to the intersection point is smaller than or equal to the width of the at least one wire. The following description will take the first contact pad CP1 as an example.

For example, as shown in FIG. 5A, a first connection line O1O2 is drawn between center points O1 and O2 of the two adjacent first contact pads CP1, and the at least one first wire 501 forms an intersection point T with the first connection line O1O2. The difference between the distance from the center point O1 of one of the two adjacent first contact pads CP1 to the intersection point T and the distance from the center point O2 of the other of the two adjacent first contact pads CP1 to the intersection point T is smaller than the width $W_{501}$ of the at least one first wire 501.

It can be understood that a second connection line (not shown in the drawing) is drawn between center points of the two adjacent second contact pads CP2, and the at least one second wire 502 forms an intersection point with the second connection line. A difference between a distance from a center point of one of the two adjacent second contact pads CP2 to the intersection point and a distance from a center point of the other of the two adjacent second contact pads CP2 to the intersection point is smaller than or equal to the width of the at least one second wire 502.

It can be understood that a third connection line (not shown in the drawing) is drawn between center points of the two adjacent third contact pads CP3, and the at least one third wire 210 forms an intersection point with the third connection line. A difference between a distance from a center point of one of the two adjacent third contact pads CP3 to the intersection point and a distance from a center point of the other of the two adjacent third contact pads CP3 to the intersection point is smaller than or equal to the width of the at least one third wire 210.

In some embodiments, any one of the first wire, the second wire, and the third wire is connected with the corresponding contact pad through a transition connection portion, and the width of the transition connection portion gradually decreases in a direction from the contact pad to the wire. In this way, a more stable connection between the wire and the contact pad can be realized, and the wire is prevented from breaking due to bending of the circuit board. In the following, the first contact pad will be taken as an example.

For example, as shown in FIG. 5A, the first wire 501 is connected with the first contact pad CP1 through a first transition connection portion N, and the width of the first transition connection portion N gradually decreases in the direction from the first contact pad to the first wire (e.g., the V direction shown in the drawing). By providing the first transition connection portion N, a more stable connection between the first wire 501 and the first contact pad CP1 can be realized, and the first wire 501 can be prevented from breaking due to bending of the circuit board.

For example, the second wire 502 and the second contact pad CP2 are connected by a second transition connection portion, and the width of the second transition connection portion gradually decreases in the direction from the second contact pad CP2 to the second wire 502. For another example, the third wire 210 is connected with the third contact pad CP3 and/or the fourth contact pad CP4 through a third transition connection portion, and the width of the third transition connection portion gradually decreases in the direction from the third contact pad CP3 and/or the fourth contact pad CP4 to the third wire 210.

In some embodiments, the conductive portion and the main contact pad are directly connected to each other. For example, as shown in FIG. 6, the first conductive portion 33 is directly connected with the first contact pad CP1 and they are in contact with each other. In this way, more stable electrical connection can be realized between them.

For example, the first conductive portion 33 contacts at least a part of the surface of the third contact pad CP3, so that the electrical connection between the first contact pad CP1 and the third contact pad CP3 is more stable. For example, as shown in FIG. 6, the third contact pad CP3 comprises a first portion (e.g., first pad portion 206) provided on the side of the second substrate 200 away from the first substrate 100 and a second portion (e.g., second pad portion 207) provided on the side of the second substrate 200 close to the first substrate 100, and the first conductive portion 33 contacts at least a surface of the second pad portion 207 of the third contact pad CP3.

In some embodiments, the second circuit board further comprises a plurality of through holes penetrating through the second substrate, and each through hole is provided to correspond to the main contact pad. The second circuit board further comprises a connection portion which covers at least a part of an inner wall of the through hole and is connected with the relay contact pad. The conductive portion fills in the through hole and is connected with the connection portion. The conductive portion extends from the through hole toward the first substrate to be connected with the main contact pad on the first substrate.

For example, as shown in FIG. 5B and FIG. 6, the second substrate 200 comprises a first bonding region BR1 and a second bonding region BR2. A plurality of first through holes 220 penetrating through the second substrate 200 are provided in the first bonding region BR1, and each of the first through holes 220 is provided to correspond to the first contact pad CP1, that is, each of the first through holes 220 corresponds to the first contact pad CP1 in position. A plurality of second through holes penetrating through the second substrate 200 are provided in the second bonding region BR2, and each of the second through holes is provided to correspond to the first contact pad CP1, that is, each of the second through holes correspond to the first contact pad CP1 in position. In the embodiments of the present disclosure, the second through hole may adopt the structure same as or different from the first through hole, which is not limited by the present disclosure. In the case that the second through hole adopts the same structure as the first through hole, the manufacturing process is simplified, so this case is preferable. In the embodiments of the present disclosure, the first connection portion corresponding to the first through hole of the first bonding region may adopt the structure same as or different from the second connection portion corresponding to the second through hole of the second bonding region; in the case that they have the same structure, the manufacturing process is simplified, so this case is preferable. Similarly, in the embodiments of the present disclosure, the first conductive portion corresponding to the first through hole of the first bonding region may adopt the structure same as or different from the second conductive portion corresponding to the second through hole of the second bonding region; in the case that they have the same structure, the manufacturing process is simplified, so this case is preferable. The description of the specific structures of the first through hole, the first connection portion and the first conductive layer in the following embodiments may also be applicable to the second through hole, the second connection portion and the second conductive layer.

For example, as shown in FIGS. 5B and 6, the second circuit board 22 further comprises a first connection portion 205 provided in the first through hole 220. The first connection portion 205 covers at least a part of the inner wall of the first through hole 220 and extends outward from the first through hole 220 to be connected with the third contact pad CP3. As shown in FIG. 6, the first conductive portion 33 fills in the first through hole 220 and is connected with the first connection portion 205, and the first conductive portion 33 extends from the first through hole 220 toward the first substrate 100 to be connected with the first contact pad CP1 provided on the first substrate 100.

For example, as shown in FIG. 5B, a part of the third wire 210 is provided in a routing region WR between the first bonding region BR1 and the second bonding region BR2. In the embodiments of the present disclosure, the third wire 210 is provided on a side of the second substrate 200 away from the first contact pad CP1 (referred to as a first side, for example, the upper side of the second substrate 200 in FIG. 6) and/or a side of the second substrate 200 close to the first contact pad CP1 (referred to as a second side, for example, a lower side of the second substrate 200 in FIG. 6). That is, the third wire 210 may be provided only on one side of the second substrate 200 or may be provided on two opposite sides of the second substrate 200, which is not limited by the embodiments of the present disclosure. For example, FIG. 6 shows an example in which the third wire 210 is provided only on the upper side of the second substrate 200.

In some embodiments, the width of each of the first wire, the second wire, and the third wire is smaller than the width of the orthographic projection of the connection portion on the second substrate and is smaller than the width of the orthographic projection of the outer profile of the relay contact pad on the second substrate. In some embodiments, the width of each of the first wire, the second wire and the third wire is smaller than the lateral size of the through hole. In the embodiments of the present disclosure, the first wire, the second wire and the third wire may have the same or different widths, which may be determined according to actual needs, and is not limited by the embodiments of the present disclosure. In the case that the first wire, the second wire and the third wire have the same width, the manufacturing process is simplified. Therefore, in the embodiments of the disclosure, the case that the first wire, the second wire and the third wire have the same width is taken as an example.

For example, in the case that the connection portion covers an entirety of the inner wall of the through hole, the orthographic projection of the connection portion on the second substrate is a closed loop shape (e.g., a circular ring shape). Furthermore, in at least one example, as shown in FIG. 5C, the width $W_{210}$ of the third wire 210 is smaller than the width $W_{205}$ of the orthographic projection of the inner profile of the connection portion on the second substrate and is smaller than the width $W_{CP3}$ of the orthographic projection of the outer profile of the third contact pad CP3 on the second substrate. In this way, the width of the wire can be further reduced and the wire density can be increased while ensuring the electrical connection between the contact pad and the wire. The width $W_{210}$ of the third wire 210 is smaller than the lateral size D of the through hole.

Figure 3B:
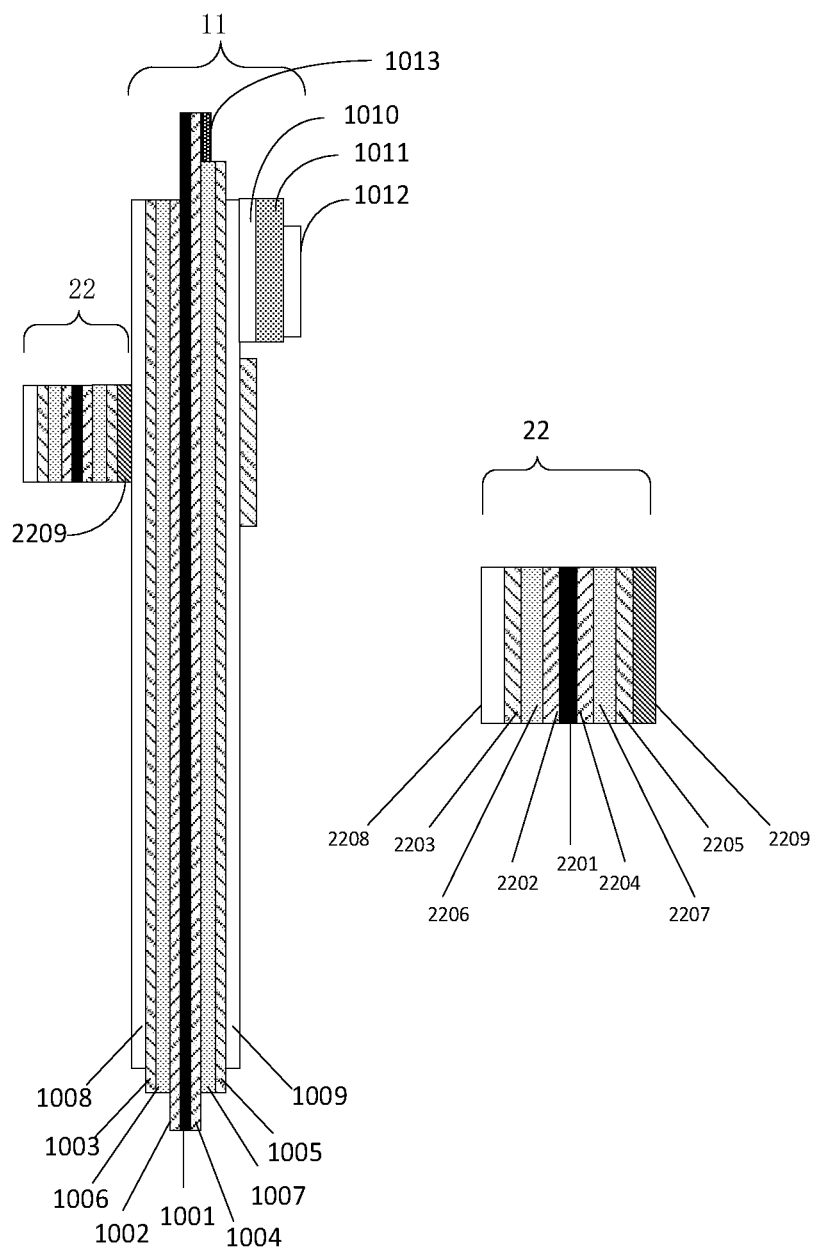
FIG. 3B is a schematic cross-sectional view of the touch display device according to the embodiment of the present disclosure taken along the line E-E of FIG. 3A.

In some embodiments, the second circuit board further comprises an adhesive layer. FIG. 3B is a schematic cross-sectional view of the touch display device according to the embodiment of the present disclosure taken along the line E-E of FIG. 3A. For example, as shown in FIG. 3B, the second circuit board 22 further comprises the adhesive layer 2209 provided on the outer surface of the second substrate 200, and the adhesive layer 2209 is used for adhering the second circuit board 22 to the first circuit board 11. The "outer surface" here refers to the surface of the second circuit board to contact with or be attached to the first circuit board. For example, as shown in FIG. 3B, the second circuit board 22 comprises a plurality of layers, and the adhesive layer 2209 is on an outermost layer of the second circuit board and is in direct contact with the first circuit board 11.

For example, as shown in FIG. 3B, the first circuit board 11 comprises a first substrate 1001, a first wiring layer 1002 and a first insulating layer 1003 provided on a first side (left side in the drawing) of the first substrate 1001, and a second wiring layer 1004 and a second insulating layer 1005 provided on a second side (right side in the drawing) of the first substrate 1001. The first insulating layer 1003 and the second insulating layer 1005 serve as protective layers to provide structural and electrical protection for the first wiring layer 1002 and the second wiring layer 1004. For example, the first circuit board 11 further comprises an adhesive layer. For example, a first adhesive layer 1006 is provided between the first wiring layer 1002 and the first insulating layer 1003, and a second adhesive layer 1007 is provided between the second wiring layer 1004 and the second insulating layer 1005. For example, the first circuit board 11 further comprises a shielding layer. The shielding layer for example is provided on the first side or the second side of the first substrate 1001, and is insulated from the wiring layer by the insulating layer. For example, as shown in FIG. 3B, a first shielding layer 1008 and a second shielding layer 1009 are provided on the first side and the second side of the first substrate 1001, respectively. The first shielding layer 1008 is insulated from the first wiring layer 1002 by the first insulating layer 1003, and the second shielding layer 1009 is insulated from the second wiring layer 1004 by the second insulating layer 1005. Therefore, the shielding layer can prevent crosstalk between signal lines. For example, the first circuit board further comprises a first adhesive agent layer 1010, a reinforcing plate 1011, and a second adhesive agent layer 1012. For example, the first adhesive agent layer 1010 comprises a thermosetting adhesive. For example, the reinforcing plate 1011 is a steel plate. Therefore, the support for the first circuit board 11 is strengthened, which is beneficial for the installation of the first circuit board.

Further, for example, the thickness of the first substrate 1001 ranges from 20 microns to 30 microns, preferably about 25 microns. The thickness of each of the first wiring layer 1002 and the second wiring layer 1004 ranges from 15 microns to 25 microns, preferably about 20 microns. The thickness of each of the first adhesive layer 1006 and the second adhesive layer 1007 ranges from 10 microns to 20 microns, preferably about 15 microns. The thickness of each of the first insulating layer 1003 and the second insulating layer 1005 ranges from 8 microns to 20 microns, preferably about 12.5 microns. The thickness of each of the first shielding layer 1008 and the second shielding layer 1009 ranges from 8 microns to 20 microns, preferably about 12 microns.

For example, as shown in FIG. 3B, the right side of the uppermost end of the second wiring layer 1004 is provided with a strip-shaped conductive structure, which is used as the first wiring terminal, the second wiring terminal and the third wiring terminal of the aforementioned flexible circuit board. Further, for example, the strip-shaped conductive structure comprises a copper layer, and a protective layer is further provided on the copper layer. For example, the protective layer comprises a metal layer. For example, the metal layer comprises a gold layer and a nickel layer. Further, in at least one example, the thickness of the gold layer ranges from 0.01 micron to 0.1 micron, preferably about 0.05 micron. The thickness of the nickel layer ranges from 1 micron to 8 microns, preferably 2 microns to 5 microns.

For example, as shown in FIG. 3B, the second circuit board 22 comprises a second substrate 2201, a first auxiliary wiring layer 2202 and a first auxiliary insulating layer 2203 provided on a first side (left side in the drawing) of the second substrate 2201, and a second auxiliary wiring layer 2204 and a second auxiliary insulating layer 2205 provided on a second side (right side in the drawing) of the first substrate 2201. The first auxiliary insulating layer 2203 and the second auxiliary insulating layer 2205 serve as protective layers to provide structural and electrical protection for the first auxiliary wiring layer 2202 and the second auxiliary wiring layer 2204. For example, the second circuit board 22 further comprises an auxiliary adhesive layer. For example, a first auxiliary adhesive layer 2206 is provided between the first auxiliary wiring layer 2202 and the first auxiliary insulating layer 2203, and the second auxiliary adhesive layer 2207 is provided between the second auxiliary wiring layer 2204 and the second auxiliary insulating layer 2205. For example, the second circuit board 22 further comprises an auxiliary shielding layer. The auxiliary shielding layer for example is provided on the first side or the second side of the second substrate 2201, and is insulated from the auxiliary wiring layer by the auxiliary insulating layer. For example, as shown in FIG. 3B, the first auxiliary shielding layer 2208 is provided on the first side of the second substrate 2201. In FIG. 3B, the outermost surface of the second circuit board 22 facing the first circuit board 11 is provided with the adhesive layer 2209, which is convenient for attaching the second circuit board 22 to the shielding layer 1008 of the first circuit board 11.

Further, for example, the thickness of each of the first auxiliary wiring layer 2202 and the second auxiliary wiring layer 2204 on the second circuit board is from 13 microns to 15 microns, preferably 14 microns. Besides the first auxiliary wiring layer 2202 and the second auxiliary wiring layer 2204, the thicknesses and materials of other layers on the second circuit board may refer to the thicknesses and materials of corresponding layers on the first circuit board, which will not be described in detail here.

In some embodiments, at least a part of the adhesive layer is provided in the bonding region of the second substrate. For example, the adhesive layer is coated not only in the routing region but also in at least one of the two bonding regions of the second substrate. For example, the adhesive layer may be provided in one bonding region or two bonding regions, which is not limited by the embodiments of the present disclosure.

Figure 3C:
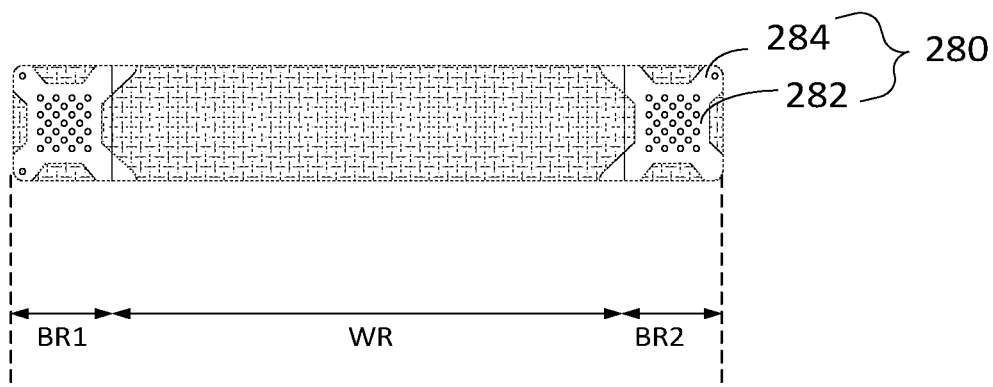
FIG. 3C is a schematic structural view of an adhesive layer of a second circuit board according to an embodiment of the present disclosure.

FIG. 3C is a schematic structural view of the adhesive layer of the second circuit board according to the embodiments of the present disclosure. For example, as shown in FIG. 3C, the adhesive layer is provided not only in the routing region WR, but also in the first bonding region BR1 and the second bonding region BR2, which is conducive to enhancing the stability of the connection between the second circuit board 22 and the first circuit board 11.

In some embodiments, the adhesive layer comprises a hollow portion. For example, as shown in FIG. 3C, the adhesive layer has the hollow portion 280, which is provided in the first bonding region BR1 and the second bonding region BR2. The orthographic projection of the through hole in the second circuit board on the adhesive layer is located in the hollow portion 280. In this way, the influence of adhesive layer on the soldering material such as the solder paste is avoided. Furthermore, in the process of filling the soldering material such as the solder paste in the through hole, the excess solder paste overflowing from the through hole flows into the hollow portion 280, thereby avoiding the influence of the excess solder paste on other components or the adhesive layer. Furthermore, as shown in FIG. 3C, the hollow portion 280 comprises a central hollow portion 282 and at least one extension hollow portion 284 connected with the central hollow portion 282. In the case that the excess solder paste overflows from the through hole, the excess solder paste flows from the central hollow portion 282 to the extension hollow portion 284, which effectively guides the flow of soldering material, thus reducing or avoiding the influence of the excess solder paste on the surrounding circuits.

In some embodiments, the connection portion covers a part or an entirety of the inner wall of the through hole. That is, at least a part of the inner wall of the through hole is provided with the connection portion. In this way, in the case that the conductive portion fills into the through hole, the conductivity and stability of the conductive portion can be improved, so that the conductive portion is not easy to fall off from the through hole.

Figure 7A:
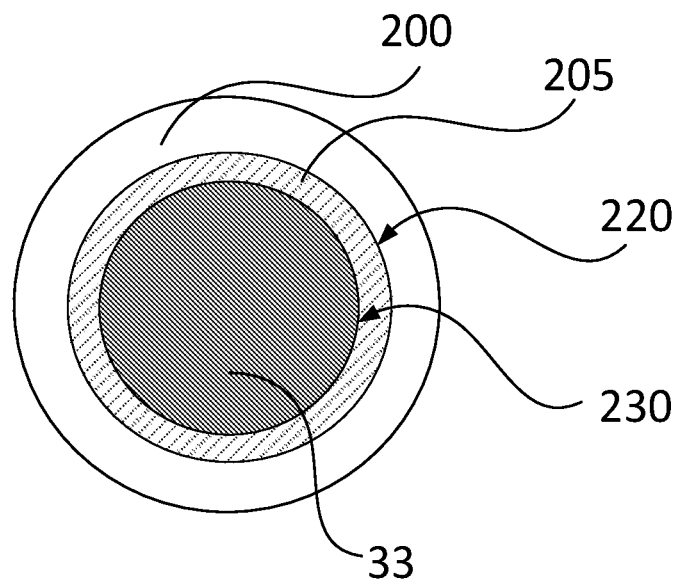
FIG. 7A is a schematic cross-sectional view of the display device according to the embodiment of the present disclosure taken along the line B-B of FIG. 6.

FIG. 7A is a schematic cross-sectional view of the display device according to the embodiment of the present disclosure taken along the line B-B of FIG. 6. As shown in FIG. 6 and FIG. 7A, the first connection portion 205 is provided in the first through hole 220 and covers the entirety of the inner wall of the first through hole 220 and forms a cavity 230. For example, the cavity 230 has a columnar shape extending in the vertical direction, and the first conductive portion 33 fills in the columnar cavity 230. Further, in at least one example, the shape of the cavity 230 comprises a circular cylinder, an elliptical cylinder and a prism. Further, for example, the prism shape comprises a triangular prism, a quadrangular prism, a polygonal prism, and the like. Since the first connection portion 205 covers the entirety of the inner wall of the first through hole 220, the first conductive portion 33 is more fully connected with the first connection portion 205 in the cavity 230, which can not only improve the conductivity and stability of the first conductive portion 33, but also prevent the first conductive portion 33 from falling off from the first through hole 220 of the second substrate 200. Therefore, it is preferable to provide the connection portion to cover the entirety of the inner wall of the through hole.

In some embodiments, the orthographic projection of the through hole on the second substrate has a closed shape (i.e., a first closed shape). For example, the closed shape comprises a regular shape or an irregular shape. For example, the regular shape comprises a centrally-symmetric shape. As shown in FIG. 7A, the orthographic projection of the first through hole 220 on the second substrate has a circular shape. In other embodiments of the present disclosure, the orthographic projection of the first through hole 220 on the second substrate may have other centrally-symmetric shapes such as ellipse, diamond, rectangle, even-sided polygon (regular polygon with even number of sides), parallelogram, cross shape, and the like. The embodiments of the present disclosure do not specifically limit this.

Figure 7B:
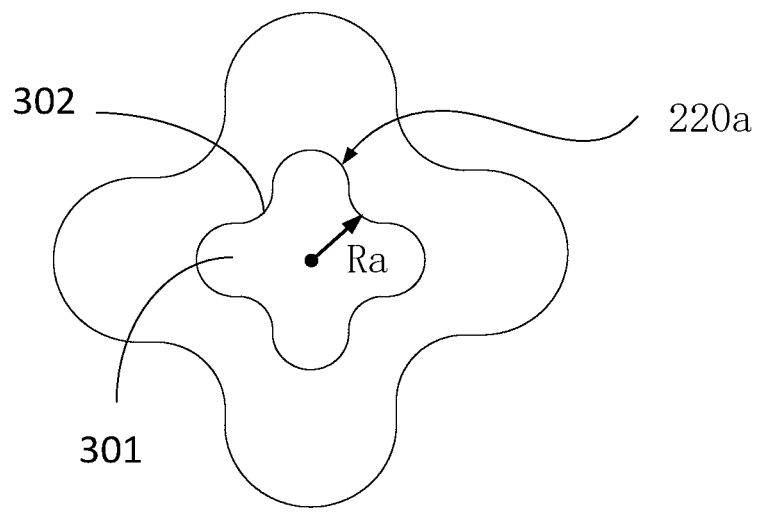
FIG. 7B to FIG. 7D are schematic views of through holes with different shapes according to embodiments of the present disclosure.
Figure 7C:
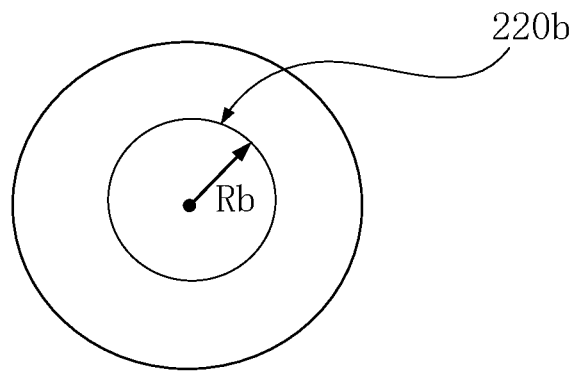
Figure 7D:
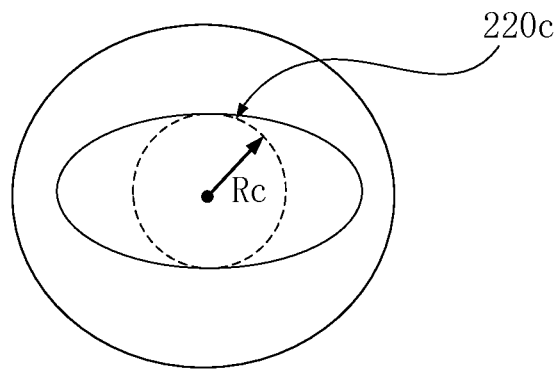

FIG. 7B to FIG. 7D are schematic views of through holes with different shapes according to embodiments of the present disclosure. For example, as shown in FIG. 7B, an orthographic projection of a first through hole 220a on the second substrate has an cross shape. In this way, it is beneficial to exhaust gas during the process of filling the solder paste. Furthermore, in at least one example, as shown in FIG. 7B, the cross shape has four convex portions 301, and every two adjacent convex portions 301 are connected with each other by an arc 302. In this way, the inner wall of the cross-shaped through hole does not have a ridge, which is more conducive to the flow of the solder paste. For example, as shown in FIG. 7C, an orthographic projection of an first through hole 220b on the second substrate has an circular shape. In another example, as shown in FIG. 7D, an orthographic projection of an first through hole 220c on the second substrate has an elliptical shape. Furthermore, under the condition that the inner lateral sizes Ra, Rb and Rc of the through holes with the above three shapes are equal to each other, the area of the circular shape is smaller than that of the elliptical shape and the cross shape, so that the height of the solder paste on the surface of the through hole with the circular shape is relatively high, which may lead to soldering failure. The height of the solder paste of the cross-shaped through hole is low, and the areas of the solder paste in two directions perpendicular to each other are approximately equal to each other, so the soldering effect of the cross-shaped through hole is the better and the cross-shaped through hole is preferable.

Figure 8:
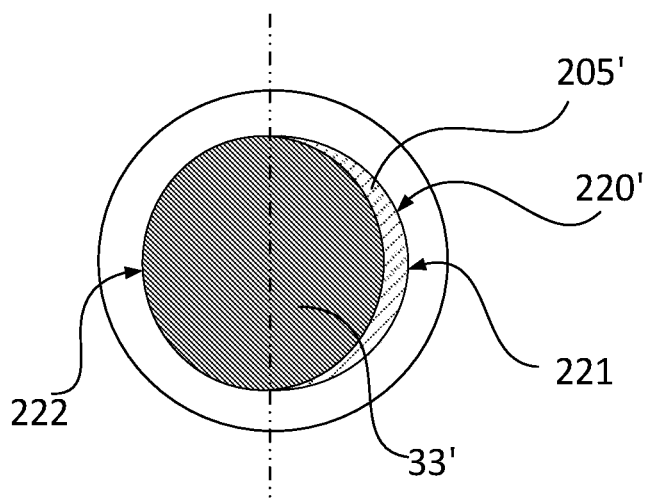
FIG. 8 is another schematic cross-sectional view of the display device according to the embodiment of the present disclosure taken along line B-B of FIG. 6.

FIG. 8 is another schematic cross-sectional view of the display device according to the embodiment of the present disclosure taken along line B-B of FIG. 6. As shown in FIG. 8, a first connection portion 205' covers a part of an inner wall of a first through hole 220' (for example, the right portion 221 is covered; the right portion 221 and the left portion 222 of the inner wall are divided by the dash-dot line in FIG. 8 as the center line, and the portion on the right side of the center line is called the right portion while the portion on the left side of the center line is called the left portion), the left portion 222 of the inner wall is exposed because it is not covered by the first connection portion 205'. In this case, one portion of a first conductive portion 33' is directly connected with the first connection portion 205', and the other portion of the first conductive portion 33' is directly connected with the left exposed portion 222 of the inner wall. This structure also achieves the purpose of connecting the first connection portion 205 and the first contact pad CP1 with each other through the first conductive portion 33', and therefore belongs to the protection scope of the disclosure. In addition, in the embodiments of the present disclosure, the filling state of the conductive portion in the through hole may comprise: the conductive portion fully filling the through hole and the conductive portion partially filling the through hole. For example, the conductive portion of FIGS. 7A and 8 substantially fully fills the through hole. In other examples, the conductive portion may partially fill the through hole, so that a void exists in the through hole. In the embodiments of the present disclosure, the void exists in the through hole, which can facilitate the gas in the soldering material to be discharged, thus facilitate the fully filling of the soldering material in the through hole.

In some embodiments, the third wire may be provided only on the first side of the second substrate, or only on the second side of the second substrate, or on both the first side and the second side of the second substrate, which is not limited by the embodiments of the present disclosure. In at least one example, in the case that there are a plurality of third wires, for example, a part of the plurality of third wires is provided on the first side of the second substrate 200, and the other part of the plurality of third wires is provided on the second side of the second substrate 200. In this way, the wires can be provided on two opposite sides of the same circuit board, which not only improves the space utilization rate of the circuit board, but also avoids the interference between the wires, so as to be beneficial to meet the design requirements of complex circuit. For example, as shown in FIG. 4, a part of the plurality of third wires 210 is provided on the upper side of the second substrate 200 (indicated by a solid line), and the other part of the plurality of third wires 210 is provided on the lower side (indicated by a broken line) of the second substrate 200.

In some embodiments, the third wire is provided on a main surface of the second substrate. For example, the connection portion is in contact with the relay contact pad along the peripheral edge of the through hole, and the relay contact pad is electrically connected with the third wire. In this way, by increasing the contact area between the connection portion and the first substrate, not only the connection between the connection portion and the first substrate can be strengthened, but also the coating of the soldering material such as solder paste on the connection portion can be facilitated, so that the soldering material flows into the through hole to form the conductive portion. Further, in at least one example, the through hole has an opening on the main surface of the second substrate, and the relay contact pad surrounds the opening. For example, as shown in FIG. 6, the main surface of the second substrate 200 is the upper surface 202 of the second substrate 200 away from the first circuit board 11 or the lower surface 204 of the second substrate 200 close to the first circuit board 11. In the embodiments, the first through hole 220 has a first opening 224 on the upper surface 202 and a second opening 226 on the lower surface 204. As shown in FIGS. 5B and 6, the first connection portion 205 is in contact with the first pad portion 206 along the peripheral edge 224a of the first opening 224, and the first pad portion 206 is electrically connected with the third wire 210. As shown in FIG. 5B and FIG. 6, since the first pad portion 206 surrounds the first opening 224, the contact area between the first pad portion 206 and the upper surface 202 is increased, so that not only the connection between the first connection portion 205 and the second substrate 200 can be strengthened, but also the coating of the first pad portion 206 with the soldering material such as the solder paste can be facilitated, so that the soldering material flows into the through hole to form the first conductive portion 33.

In some embodiments, for example, in the case that the first connection portion 205 covers the entirety of the inner wall of the first through hole 220, the orthographic projection of the outer profile of the first pad portion 206 on the second substrate 200 is a circular shape. It can be understood that the above orthographic projection is not limited to the circular shape, and it may be ellipse, triangle, rectangle, regular polygon, irregular shape or other shapes, which will be described in further detail in later description of the embodiments of the disclosure.

In some embodiments, as shown in FIG. 6, the second pad portion 207 is further provided on the lower surface 204 of the second substrate 200. For example, the first connection portion 205 is in contact with the second pad portion 207 along the peripheral edge 226a of the second opening 226. The first through hole 220 is provided with the second opening 226 on the lower surface 204. Since the second pad portion 207 surrounds the second opening 226, the contact area between the second pad portion 207 and the lower surface 202 is increased, thereby reinforcing the connection between the connection portion 205 and the second substrate 200 and preventing the first conductive portion 33 or the first connection portion 205 from falling off from the second substrate 200. In the embodiments of the present disclosure, the second pad portion 207 and the first pad portion 206 may be same as or different from each other in shape, size and arrangement mode. In the case that the second pad portion 207 and the first pad portion 206 are same as each other in shape, size and arrangement mode, the manufacturing process can be simplified, so this case is preferable.

In the embodiments of the present disclosure, by forming the first pad portion 206 and the second pad portion 207 respectively on the upper surface 202 and the lower surface 204 of the second substrate 200, not only the total number of the signal lines can be increased, but also the space utilization rate of the circuit board can be improved, and the flexibility in designing the signal lines can be improved. For example, in the case that the signal lines need to be provided on the upper surface 202, a signal channel may be formed by using the first pad portion 206; in the case that the signal lines need to be provided on the lower surface 204, a signal channel may be formed by using the second pad portion 207. Therefore, it is preferable to form the first pad portion 206 and the second pad portion 207 on the two surfaces 202 and 204, respectively. In other embodiments of the present disclosure, providing only the first pad portion 206 on the upper surface 202 or providing only the second pad portion 207 on the lower surface 204, may also form electrical connection between the signal lines on two circuit boards, and thus also falls within the scope of protection of the present disclosure.

In some embodiments, a plurality of layers are provided on at least one side of the second substrate, and the third wire is provided in at least one of the plurality of layers. By arranging the third wire in the plurality of layers of the second circuit board, the wirer on the second circuit board, such as the third wire, can be flexibly provided by making full use of space of the second circuit board, thus meeting the design requirements of complex circuit in different applications.

Figure 9:
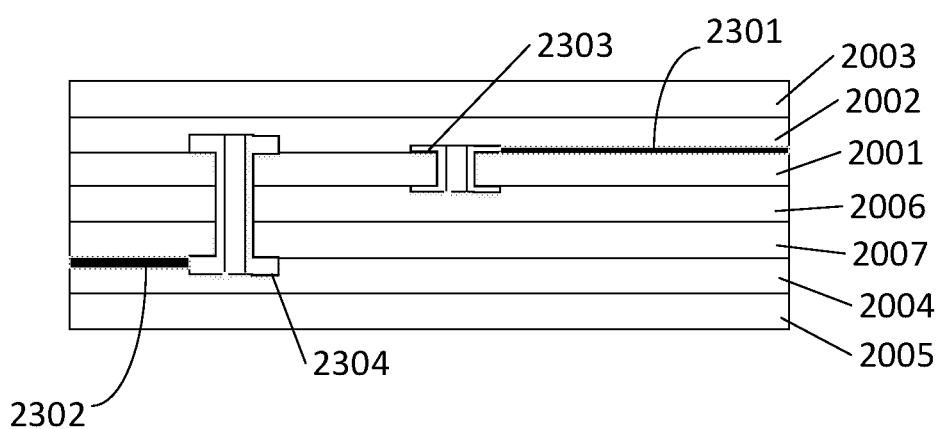
FIG. 9 is a schematic cross-sectional view of another second circuit board according to an embodiment of the disclosure.
Figure 10A:
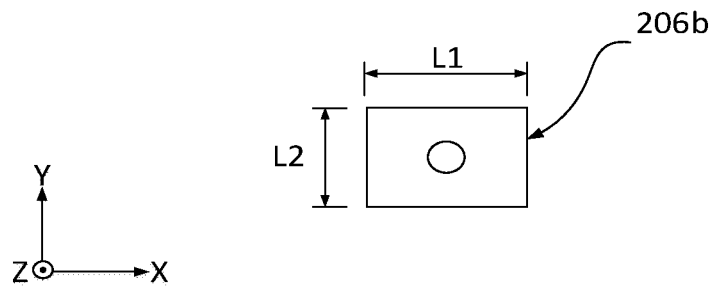
FIG. 10A to FIG. 10D are schematic views of contact pad with different shapes according to an embodiment of the present disclosure.
Figure 10B:
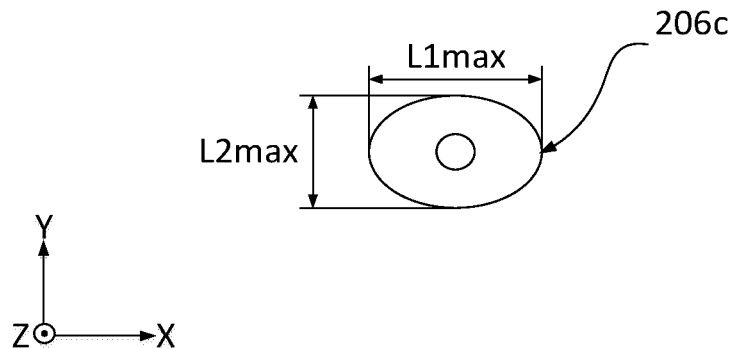
Figure 10C:
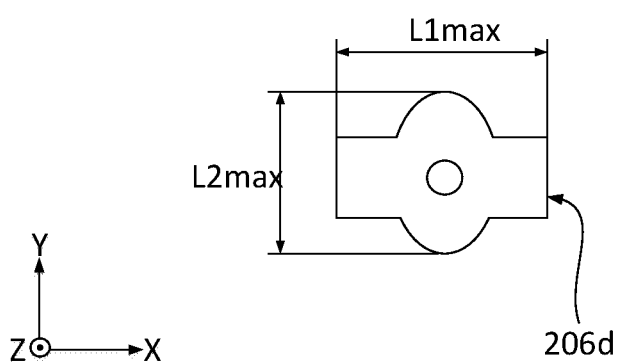
Figure 10D:
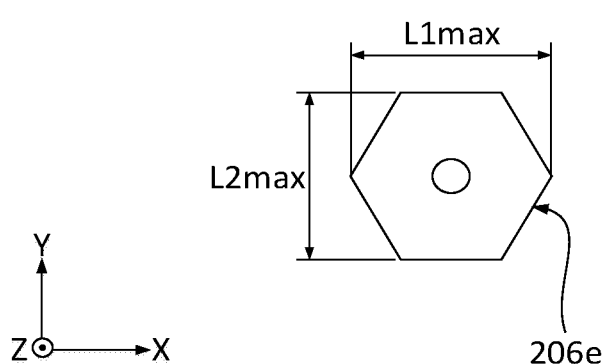

FIG. 9 is a schematic cross-sectional view of another second circuit board according to an embodiment of the disclosure. For example, as shown in FIG. 9, a second circuit board comprises a second substrate 2001, a first auxiliary wiring layer 2002 and a first auxiliary insulating layer 2003 provided on a first side (upper side) of the second substrate 2001, and a second auxiliary wiring layer 2004 and a second auxiliary insulating layer 2005 provided on a second side (lower side) of the second substrate 2001. The first auxiliary insulating layer 2003 and the second auxiliary insulating layer 2005 serve as the protective layers to provide structural and electrical protection for the first auxiliary wiring layer 2002 and the second auxiliary wiring layer 2004. For example, the second circuit board further comprises an adhesive layer 2006. The adhesive layer 2006 is provided on the first side or the second side of the second substrate 2001; for example, as shown in FIG. 9, the adhesive layer 2006 is provided on the second side of the second substrate 2001 for bonding the third auxiliary insulating layer 2007.

In some embodiments, the third wire of the second circuit board for example is provided on the surface of the insulating layer of the second circuit board. For example, as shown in FIG. 9, the second auxiliary wiring layer 2004 comprises a second auxiliary wire 2302 provided on the surface of the third auxiliary insulating layer 2007. The second auxiliary wiring layer 2004 further comprises a second wire contact pad 2304, which is also provided on the surface of the third auxiliary insulating layer 2007 and is connected with the second auxiliary wire 2302. By arranging the second auxiliary wire 2302 on the surface of the third auxiliary insulating layer 2007, the space utilization rate of the second circuit board can be improved. It can be understood that the second auxiliary wire 2302 may be provided on the surface of other insulating layers except the third auxiliary insulating layer 2007, which will not be described in detail here.

Optionally, the plurality of third wires are distributed in different layers of the second substrate. For example, as shown in FIG. 9, the first auxiliary wiring layer 2002 comprises a first auxiliary wire 2301 provided on the main surface of the second substrate 2001, and the first auxiliary wiring layer 2002 further comprises a first wire contact pad 2303 provided on the main surface of the second substrate 2001 and electrically connected with the first auxiliary wire 2301. In this way, by arranging the first auxiliary wire 2301 and the second auxiliary wire 2302 in different layers of the second substrate 2001, the wires can be flexibly provided by making full use of space of the second substrate 2001, thus meeting the design requirements of complex circuit in different applications. It can be understood that in the case that the wires are provided in different layers, the through hole, which corresponds to the contact pad connected with the wire, not only penetrates through the second substrate but also penetrates through the corresponding layers, so as to ensure that the first circuit board and the second circuit board are electrically connected with each other through the conductive portion provided in the through hole.

In some embodiments, the orthographic projection of the through hole on the second substrate is located in the orthographic projection of the outer profile of the relay contact pad on the second substrate, and the orthographic projection of the outer profile of the relay contact pad on the second substrate has a second closed shape. In the embodiments of the present disclosure, the first contact pad, the second contact pad, the third contact pad and the fourth contact pad may have different shapes. In the following, the third contact pad will be described as an example.

In some embodiments, the orthographic projection of the outer profile of the third contact pad on the second substrate has a closed shape (i.e., the second closed shape), and the orthographic projection of the through hole on the second substrate is located in the orthographic projection of the outer profile of the third contact pad on the second substrate.

For example, as shown in FIG. 5B, the orthographic projection of the first through hole 220 on the second substrate 200 is located in the orthographic projection of the outer profile 206a of the first pad portion 206 on the second substrate. For example, as shown in FIG. 5B, the orthographic projection of the outer profile 206a of the first pad portion 206 on the second substrate 200 has the circular shape. In the existing design, the pad (such as gold finger) is usually strip-shaped, and the area of the pad is about 0.25 mm*1.2 mm. However, in the embodiments, the third contact pad has the circular shape, which not only helps to reduce the soldering area of each signal channel and the soldering area of the circuit board, but also ensures that there is enough routing space between adjacent third contact pads, so that the routing design of the signal lines can be facilitate. For example, the radius of the circular third contact pad is between 0.1 mm and 0.3 mm, preferably about 0.15 mm. It can be understood that the orthographic projection of the outer profile 206a of the first pad portion 206 on the second substrate 200 is not limited to the circular shape, and may have other closed shapes. For example, the closed shape comprises a regular shape or an irregular shape. Further, in at least one example, the regular shape comprises a centrally-symmetric shape, such as an ellipse, a diamond, a rectangle, an even-sided polygon (a regular polygon with an even number of sides), a parallelogram, or other regular shapes. For another example, other regular shapes comprise a shape that is a combination of the rectangle and the ellipse. For example, the orthographic projection of the outer profile 206a of the first pad portion 206 on the second substrate 200 is a triangle, a trapezoid, an odd-sided polygon (a polygon with odd number of sides), etc., which is not limited by the embodiments of the present disclosure. FIG. 10A to FIG. 10D are schematic views of pad portions with different shapes according to the embodiments of the present disclosure. As shown in FIGS. 10A to 10D, for example, the first pad portion 206 has a rectangular outer profile 206b, an elliptical outer profile 206c, a special-shaped outer profile 206d, or a regular hexagonal outer profile 206e.

In some embodiments, the orthographic projection of the outer profile of the third contact pad on the second substrate has a closed shape. The closed shape has a first length parallel to the first direction of the second substrate and a second length parallel to the second direction of the second substrate, the first direction and the second direction are perpendicular to each other. The maximum value of the first length is greater than the maximum value of the second length. In this way, it is beneficial to increase the pressing area of the third contact pad during the formation of the insulating layer later, and improve the connection firmness between the third contact pad and the second substrate.

For example, as shown in FIGS. 10A to 10D, the first direction is the X direction (e.g., horizontal direction), and the second direction is the Y direction (e.g., vertical direction). Each shape has the first length L1 parallel to the X direction of the second substrate 200 and the second length L2 parallel to the Y direction of the second substrate 200. For example, the first length is from 0.1 mm to 0.7 mm, and the second length is from 0.1 mm to 0.4 mm. The X direction is perpendicular to the Y direction, and the maximum value L1max of the first length is greater than the maximum value L2max of the second length. Because the length of the first pad portion 206 in the first direction is larger, it is beneficial to increase the contact area between the first pad portion 206 and the first insulating layer 252 during the formation of the first insulating layer 252 on the first pad portion 206, thereby improving the connection firmness between the first pad portion 206 and the second substrate 200 and preventing the first pad portion 206 from separating from or falling off from the second substrate 200. Further, in at least one example, the second circuit board 22 has a strip shape, and the above-mentioned X direction is parallel to the extension direction of the second circuit board 22. In this way, in the case that the strip-shaped second circuit board 22 is bended, the length of the first pad portion 206 in the X direction is larger so that the pressing area of the insulating layer is larger, and thus the bending resistance of the first pad portion 206 is improved and the first pad portion 206 is not easy to fall off from the second substrate 200.

In some embodiments, a plurality of through holes and a plurality relay contact pads are provided in each bonding region of the second circuit board, and the plurality of through holes and the plurality of relay contact pads correspond to each other one by one. The plurality of through holes are provided in multiple lines, and the through holes in odd lines are staggered with the through holes in even lines. In this way, the total number and density of signal channels can be increased, the soldering area on the circuit board can be reduced, and mutual interference of the signal channels can be avoided. In the embodiments of the present disclosure, the term "line" may refer to either the row direction or the column direction.

As shown in FIG. 5B, the first bonding region BR1 is provided with a plurality of first through holes 220, and one third contact pad CP3 is provided for each through hole 220. In at least one example, the total number of the first through holes in the first bonding region BR1 is the same as that in the second bonding region BR2, for example, the total number of the first through holes is 25. To avoid confusion, only five third contact pads CP3 corresponding to five first wires 501 are illustrated in the first bonding region BR1, and only five fourth contact pads CP4 corresponding to five second wires 502 are illustrated in the second bonding region BR2. It can be understood that the total number of the above-mentioned wires, contact pads and through holes is only exemplary, and in other embodiments, it can be designed according to the actual needs of products, which is not limited in the embodiments of the disclosure.

Figure 11:
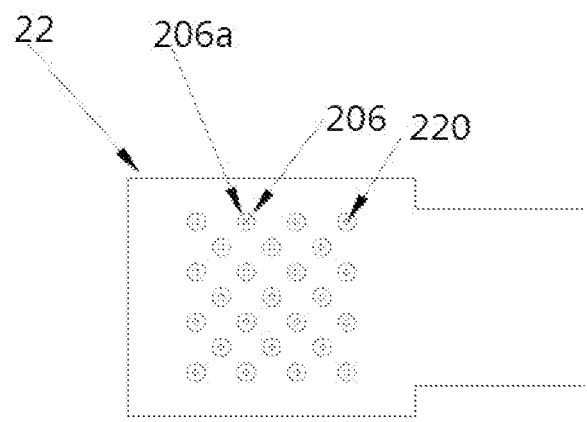
FIG. 11 is a schematic structural view of a bonding region of a second circuit board according to an embodiment of the present disclosure.

FIG. 11 is a schematic structural view of the bonding region of the second circuit board according to the embodiments of the present disclosure. For example, as shown in FIG. 11, each first through hole 220 corresponds to the first pad portion 206 of the third contact pad, that is, each first pad portion 206 surrounds one first through hole 220. The plurality of first through holes 220 are provided in an array. For example, 25 through holes are provided in 7 lines, each odd line is provided with 4 through holes, each even line is provided with 3 through holes, and the through holes in each line are provided at equal intervals. In this way, the space of rectangular bonding region can be fully and reasonably utilized, which not only ensures that there is a certain gap between adjacent signal lines, but also improves the distribution density of the signal lines. Further, as shown in FIG. 11, the first through holes 220 in odd lines are staggered with the first through holes 220 in even lines. For example, the first through holes 220 in the even rows are staggered with the first through holes 220 in the odd rows by ½ of a distance, herein, the distance refers to the horizontal distance between two adjacent first through holes 220 in the row direction. For another example, the first through holes 220 in the even columns are staggered with the first through holes 220 in the odd columns by ½ of a distance, herein, the distance refers to the vertical distance between two adjacent first through holes 220 in the column direction.

Figure 12:
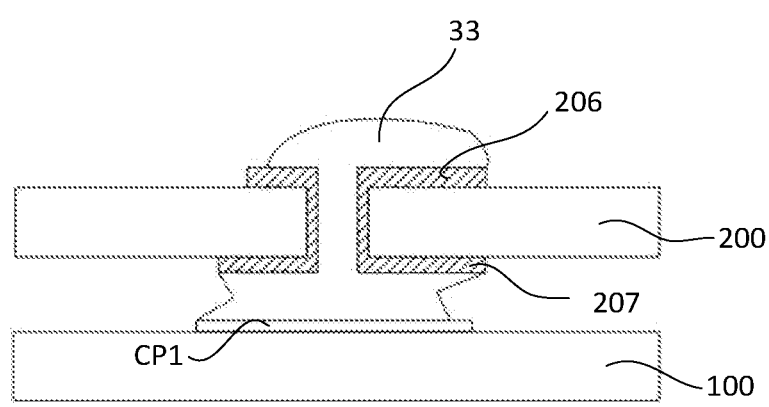
FIG. 12 is a SEM (scanning electron microscope) photograph of a bonding region of a second circuit board according to an embodiment of the present disclosure.

FIG. 12 is a SEM (scanning electron microscope) photograph of the bonding region of the second circuit board according to the embodiments of the present disclosure. As shown in FIG. 12, the shape of the bonding region of the second circuit board 22 is substantially rectangular. Compared with the conventional strip-shaped gold finger soldering area, not only the total number and density of the signal lines are increased, but also the area of the whole soldering area on the circuit board is reduced and the mutual interference between signal channels is avoids. In addition, in the right cross-sectional SEM photograph, the first through hole is completely filled by the first conductive portion 33 (also referred as that the solder paste is adequate), and the first contact pad CP1 is electrically connected with the first pad portion 206 and the second pad portion 207 through the first conductive portion 33.

Figure 13:
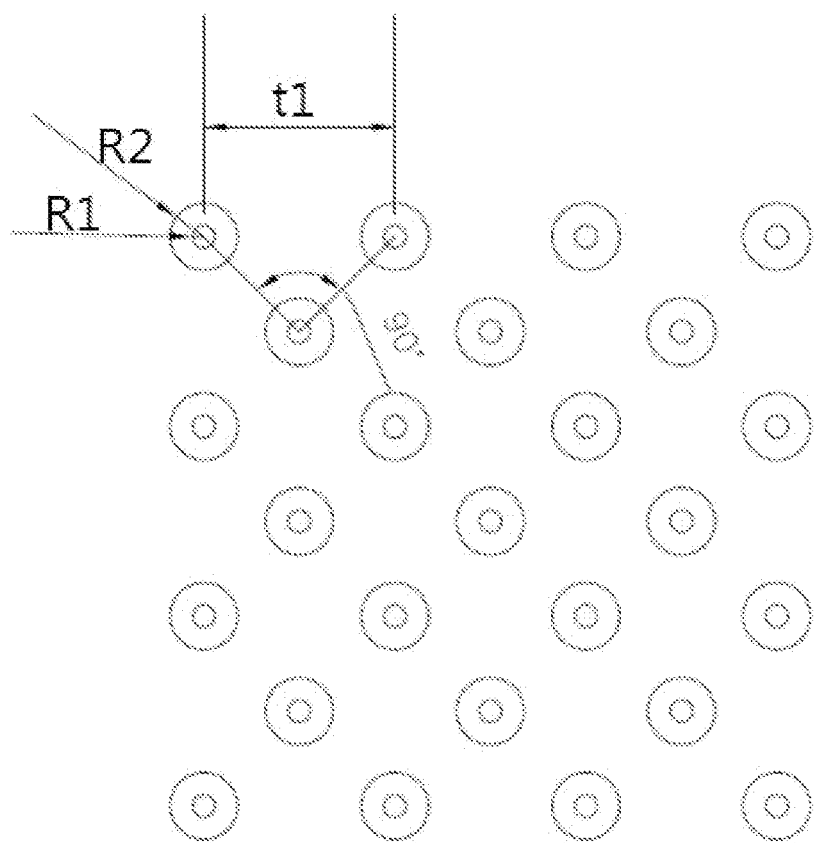
FIG. 13 to FIG. 16 are schematic structural views of various bonding regions according to an embodiment of the present disclosure.
Figure 14:
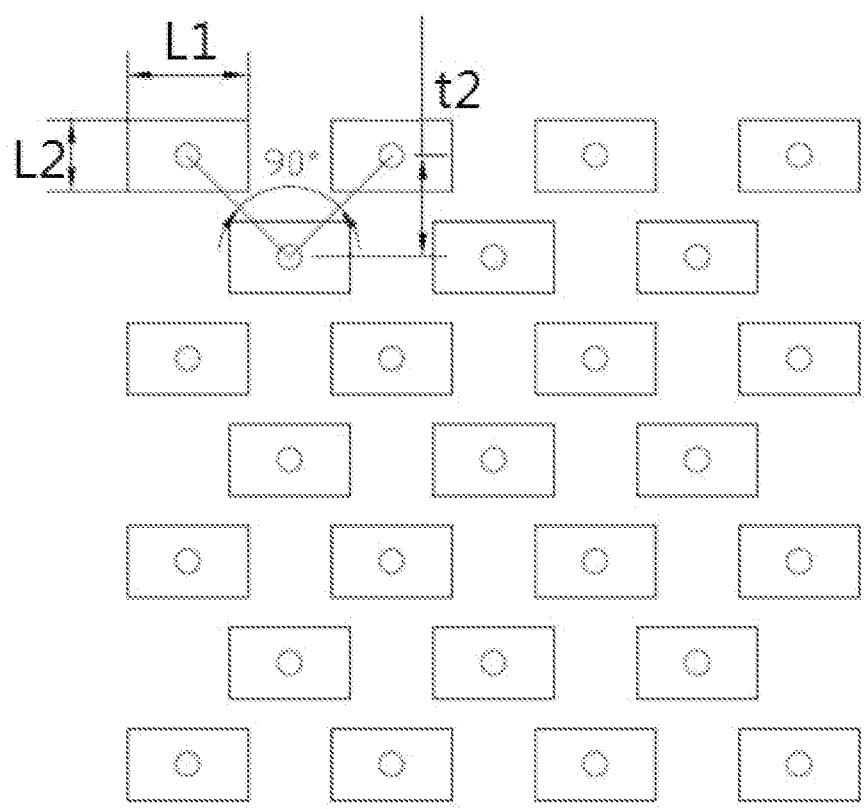
Figure 15:
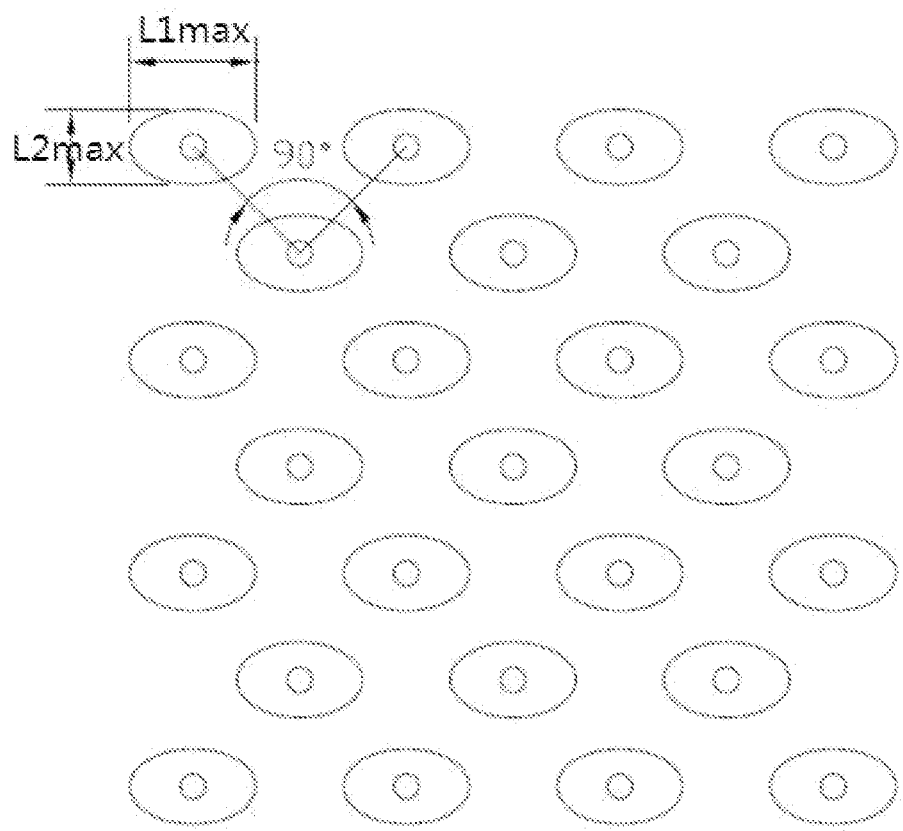
Figure 16:
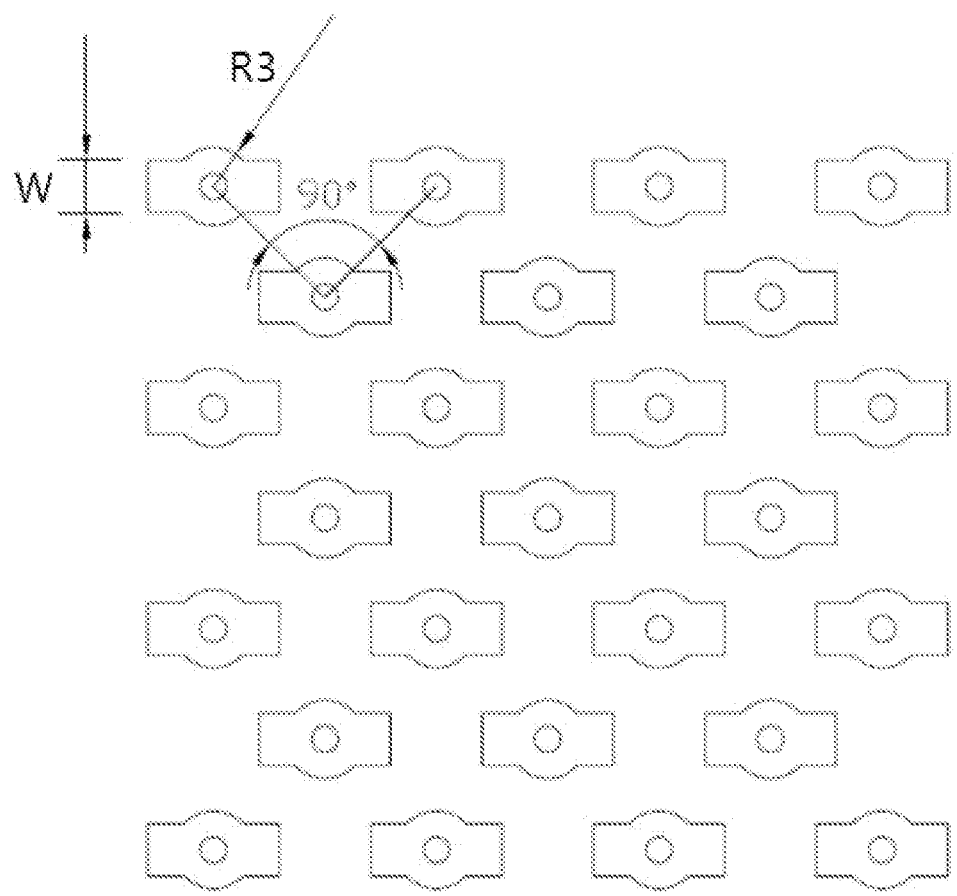

FIG. 13 to FIG. 16 are schematic structural views of various bonding regions according to embodiments of the present disclosure. As shown in FIG. 13, the outer profile of the third contact pad and/or the fourth contact pad is circular, and the cavity surrounded by the connection portion is a circular cylinder. The radius R2 of the circle is, for example, from 0.1 mm to 0.3 mm, preferably about 0.15 mm. For example, the radius R1 of the end surface of the cavity of circular cylinder is from 0.01 mm to 0.1 mm, preferably about 0.05 mm. For example, the plurality of third contact pads in the first direction are provided at equal intervals, and the interval t1 is, for example, from 0.5 mm to 1 mm, preferably about 0.85 mm. As shown in FIG. 14, the outer profile of the third contact pad is rectangular. For example, the length L1 of the rectangle in the first direction is from 0.3 mm to 0.7 mm, preferably about 0.5 mm, and the length L2 of the rectangle in the second direction is from 0.1 mm to 0.4 mm, preferably about 0.3 mm. For example, the plurality of rows of third contact pads are provided at equal intervals, and the interval t2 is, for example, from 0.1 mm to 1 mm, preferably about 0.4 mm. As shown in FIG. 15, for example, the outer profile of the third contact pad is elliptical. The maximum length L1max of the ellipse in the first direction is from 0.3 mm to 0.7 mm, preferably about 0.5 mm; and the maximum length L2max of the ellipse in the second direction is from 0.1 mm to 0.4 mm, preferably about 0.3 mm. As shown in FIG. 16, the outer profile of the third contact pad has an irregular shape. For example, the irregular shape is a combination of a rectangle and a circle, the radius R3 of the circle is from 0.1 mm to 0.3 mm, preferably about 0.15 mm, and the length W of the rectangle in the second direction is from 0.1 mm to 0.5 mm, preferably about 0.2 mm. The term "about" in the embodiments of the disclosure can be understood as that the value is not strictly limited, and values within the range of process errors and measurement errors are allowed.

In FIG. 13 to FIG. 16, as described above, the through holes in the odd lines are staggered with the through holes in the even lines, so that the total number and density of the signal channels can be increased, the soldering area on the circuit board can be reduced, and mutual interference of the signal channels can be avoided. Further, for example, in FIGS. 13 to 16, for the through holes in two adjacent lines (called as first and second rows), each through hole (called as lower through hole) in the second row is provided on the center line between two through holes (called left and right through holes) which are in the first row and adjacent to the lower through hole. In at least one example, for example, the included angle between the connection line between the center of the lower through hole and the center of the left through hole and the connection line between the center of the lower through hole and the center of the right through hole is 90 degrees. In this way, the mutual interference of signal channels is avoided, and the manufacturing process is simplified.

In some embodiments, the second circuit board further comprises an insulating layer provided on a side of the third contact pad away from the second substrate, and the insulating layer comprises an opening exposing the through hole and exposing a part of the third contact pad provided around the through hole. In this way. Because the through hole is exposed in the opening, it is convenient to fill the soldering material for forming the conductive portion into the through hole through the opening and allow the conductive portion to contact the exposed third contact pad, thus further ensuring the firm connection between the conductive portion and the connection portion. For example, as shown in FIG. 6, the second circuit board 22 further comprises a first insulating layer 252 provided on the side of the first pad portion 206 away from the second substrate 200. The first insulating layer 252 comprises a first opening 262 that exposes the first through hole 220 and a part of the first pad portion 206 provided around the first through hole 220. Furthermore, in at least one example, as shown in FIG. 6, the first insulating layer 252 covers the edge portion ED of the first pad portion 206, so that the covered edge portion ED of the first pad portion 206 is more firmly attached to the second substrate 200, thereby preventing the first pad portion 206 from separating from or falling off from the second substrate 200 due to warping of the edge portion. For example, the first insulating layer 252 is a green oil layer, which plays a role of solder resist.

Figure 17:
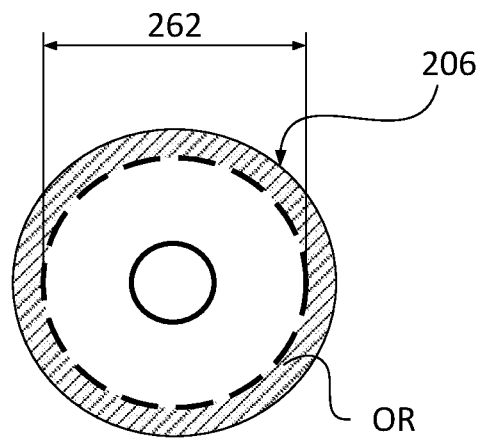
FIG. 17 is a top view of an opening of a first insulating layer of a second circuit board according to an embodiment of the present disclosure.
Figure 18A:
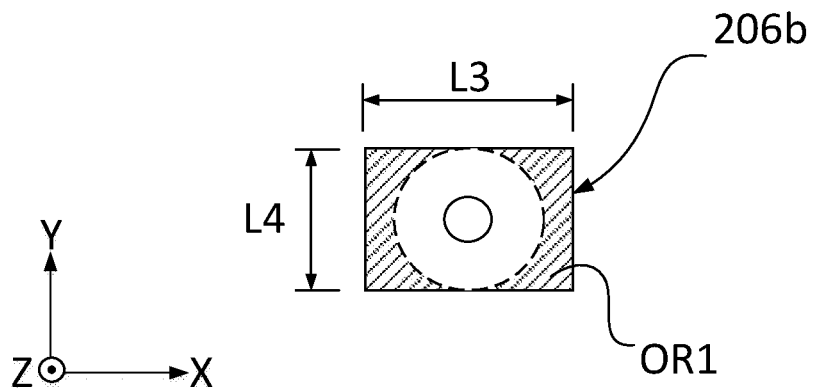
FIG. 18A to FIG. 18D are schematic views of various overlapping regions on a second circuit board according to an embodiment of the present disclosure.
Figure 18B:
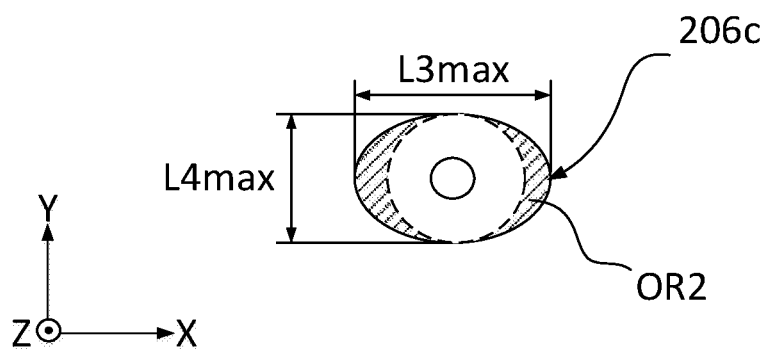
Figure 18C:
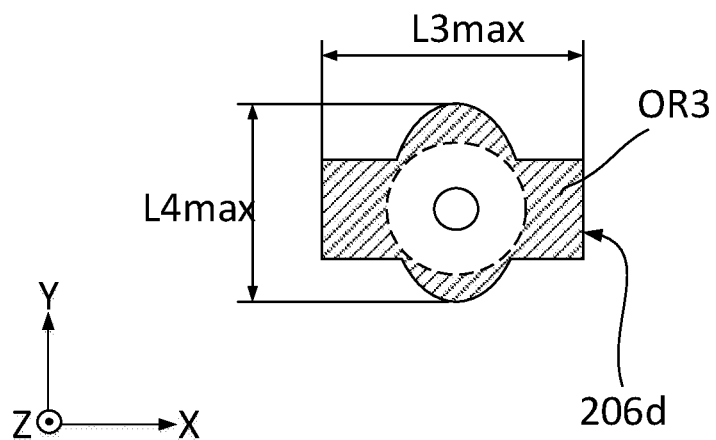
Figure 18D:
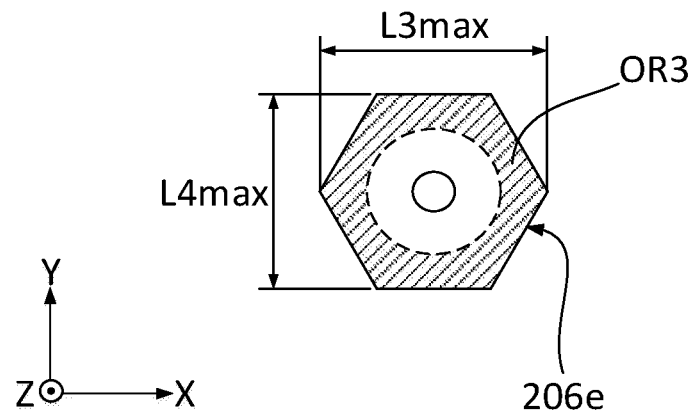

In some embodiments, the orthographic projection of the insulating layer on the second substrate and the orthographic projection of the third contact pad on the second substrate has an overlapping region, and the overlapping region surrounds the orthographic projection of the through hole on the second substrate. In this way, the part of the third contact pad covered by the insulating layer surrounds the through hole, which further ensures that the third contact pad around the through hole does not fall off from the second substrate, and also ensures that a stable electrical connection is formed between the conductive portion formed later and the third contact pad. FIG. 17 is a top view of the opening of the first insulating layer of the second circuit board according to the embodiments of the present disclosure. Referring to FIG. 6 and FIG. 17, the area within the dashed line represents the first opening 262 of the first insulating layer 252. The slanted-line area in FIG. 17 is the area where the first insulating layer 252 covers the first pad portion 206, that is, the overlapping region OR between the orthographic projection of the first insulating layer 252 on the second substrate 200 and the orthographic projection of the first pad portion 206 on the second substrate 200. As shown in FIG. 17, the overlapping region OR surrounds the orthographic projection of the first through hole 220 on the second substrate 200. In this way, the part of the first pad portion 206 covered by the first insulating layer 252 surrounds the first through hole 220, which further ensures that the first pad portion 206 around the first through hole 220 does not fall off from the second substrate 200, and also ensures that a firm connection is formed between the first conductive portion 33 formed later and the first pad portion 206.

In some embodiments, the outer profile of the overlapping region has a third length parallel to the first direction of the second substrate and a fourth length parallel to the second direction of the second substrate, the first direction is perpendicular to the second direction, and the maximum value of the third length is greater than the maximum value of the fourth length. FIG. 18A to FIG. 18D are schematic views of various overlapping regions on a second circuit board according to embodiments of the present disclosure. For example, as shown in FIG. 18A to FIG. 18D, the outer profile of the overlapping region is rectangular, elliptical, special-shaped or regular hexagon. The outer profile of each of the overlapping regions OR1, OR2, OR3, OR4 has the third length L3 parallel to the X direction of the second substrate 200 and the fourth length L4 parallel to the Y direction of the second substrate 200, and the X direction and the Y direction are perpendicular to each other. For example, the third length L3 is from 0.3 mm to 0.7 mm, preferably about 0.5 mm, and the fourth length L4 is from 0.1 mm to 0.4 mm, preferably about 0.3 mm. The maximum value L3max of the third length is greater than the maximum value L4max of the fourth length. The length of the overlapping region is larger in the X direction, so that the overlapping region is larger, thereby increasing the contact area between the first pad portion 206 and the first insulating layer 252, improving the connection firmness between the first pad portion 206 and the second substrate 200, and preventing the first pad portion 206 from separating from or falling off from the second substrate 200.

In some embodiments, as shown in FIG. 6, a portion of the first conductive portion 33 extends outward from the cavity 230 to cover the exposed portion of the first pad portion 206. Further, in at least one example, the first opening 262 of the first insulating layer 252 is used as a coating area of solder material (e.g., solder paste), and the solder material coated in the coating area flows into the cavity 230 to serve as the first conductive portion 33. In this way, the first opening 262 in the first insulating layer 252 is also used to define an area for containing the solder material (i.e., forming a region for coating the solder material), which is convenient for accurately coating the solder material, and is conducive to realizing automatic surface mounting technology.

In some embodiments, the maximum height of the first conductive portion 33 relative to the second substrate 200 is higher than the maximum height of the third contact pad CP3 relative to the second substrate 200, so that sufficient contact is formed between the first conductive portion 33 and the third contact pad CP3, and the through hole is filled as much as possible during filling the solder material to enhance the stability of the signal channel between the first circuit board and the second circuit board. Further, in at least one example, the difference between the maximum height of the first conductive portion 33 relative to the second substrate 200 and the maximum height of the third contact pad CP3 relative to the second substrate 200 is greater than zero and smaller than 0.5 mm. For example, the difference is greater than zero and smaller than or equal to 0.1 mm.

Figure 22:
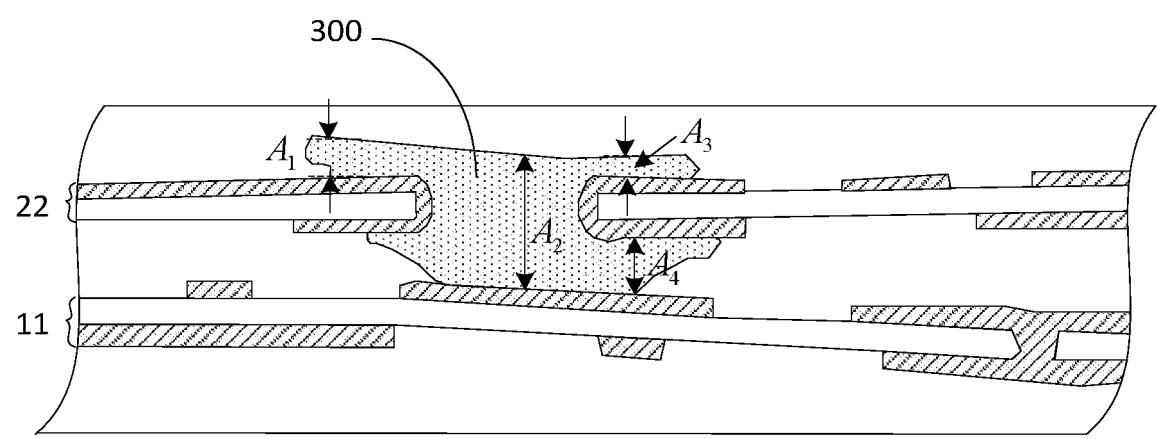
FIG. 22 is a schematic view of thicknesses of a conductive portion at various positions after a first circuit board and a second circuit board are soldered together according to an embodiment of the present disclosure.

For example, FIG. 22 is a schematic view of thicknesses of the conductive portion (e.g., solder paste 300) at various positions after the first circuit board and the second circuit board are soldered together according to the embodiments of the present disclosure. As shown in FIG. 22, at the position of the solder joint, the height A2 of the solder paste in the through hole relative to the main contact pad is about 123.4 microns. On the upper surface of the second circuit board 22 (i.e. the surface of the second circuit board 22 away from the first circuit board 11), the height A3 of the right solder paste relative to the upper surface is about 19.9 microns, and the height A1 of the left solder paste relative to the upper surface is about 34.3 microns. The distance A4 between the solder paste on the right side and the lower surface of the second circuit board 22 (i.e. the surface of the second circuit board 22 close to the first circuit board 11) is about 53.3 microns.

For example, as shown in FIG. 17, the shape of the first opening 262 in a plane parallel to the second substrate 200 is a circle. It can be understood that the shape of the first opening 262 is not limited to the circle, but may be a regular shape such as an ellipse, a triangle, a rectangle, a regular polygon, a parallelogram, or an irregular, which is not limited by the embodiments of the present disclosure.

In some embodiments, the second circuit board 22 further comprises a second insulating layer 254 provided on a side of the first pad portion 206 away from the second substrate 200, and the second insulating layer 254 comprises a second opening 264. The shape, size and arrangement manner of the second opening 264 may refer to the description of the first opening 262, and will not be described in detail here. In the embodiments of the present disclosure, the first opening 262 and the second opening 264 may be the same or different in shape, size and arrangement manner. In the case that they are the same in shape, size and arrangement manner, the manufacturing process can be simplified, so the case is preferable.

Figure 19:
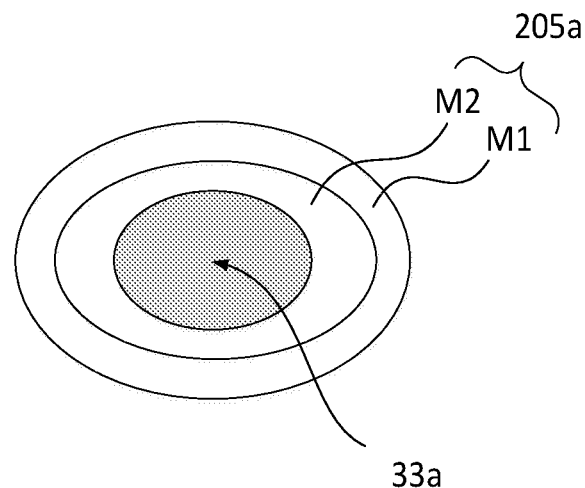
FIG. 19 is a top view of a connection portion according to an embodiment of the present disclosure.

In some embodiments, the connection portion comprises a first metal layer and a second metal layer, and the metal activity of the second metal layer is lower than that of the first metal layer. FIG. 19 is a top view of a connection portion according to an embodiment of the present disclosure. For example, as shown in FIG. 19, the first connection portion 205a comprises a first metal layer M1 comprising copper and a second metal layer M2 comprising at least one of gold and nickel. Further, in at least one example, the second metal layer M2 is closer to the conductive portion than the first metal layer M1. By covering the first metal layer M1 with the second metal layer M2, the first metal layer M1 can be prevented from being oxidized and the conductivity stability of the first metal layer M1 can be improved. For example, as shown in FIG. 19, in the through hole, the second metal layer M2 is closer to the first conductive portion 33a than the first metal layer M1, which can prevent the first metal layer M1 from being oxidized and improve the conductive stability of the first metal layer M1. For example, the thickness of the first metal layer M1 is from 10 microns to 50 microns, preferably from 12 microns to 20 microns. For example, the thickness of the second metal layer M2 is from 1 microns to 10 microns, preferably 2 microns to 5 microns. Further, in at least one example, in the case that the second metal layer M2 comprises both nickel and gold, the second metal layer comprises a stack of nickel sub-layer and gold sub-layer. For example, the thickness of the nickel sub-layer is 40 to 80 times of that of the gold sub-layer. Further, in at least one example, the thickness of the nickel sub-layer is from 2 microns to 4 microns, and the thickness of the gold sub-layer is about 0.05 microns. Optionally, the first metal layer M1 and the second metal layer M2 are further provided on the main contact pad of the first circuit board 11 for protecting the main contact pad; for specific materials and thicknesses, please refer to the above descriptions. Optionally, the first metal layer M1 and the second metal layer M2 are further provided on the relay contact pad of the second circuit board 22 for protecting the relay contact pad; for specific material and thicknesses, please refer to the above descriptions.

In some embodiments, as shown in FIG. 6, the first circuit board further comprises a third insulating layer 108, which may have the same structure as the first insulating layer 252. For example, the third insulating layer 108 comprises an opening to expose a part of the first contact pad. For example, as shown in FIG. 5A, the plurality of first contact pads CP1 are provided on the first substrate 100, and each first contact pad CP1 is correspondingly provided with one touch wire, such as one first wire 501. For example, each first contact pad CP1 is circular. It can be understood that the circular shape is only exemplary, and the first contact pad CP1 may have other closed shapes. For the shape of the orthographic projection of the first contact pad CP1 on the second substrate, please refer to the previous descriptions about the third contact pad, which will not be repeated in detail here. The shape of the first contact pad and the shape of the outer profile of the third contact pad may be the same or different; in the case that they are the same, the manufacturing process can be simplified, so the case is preferable. In the embodiments, in order to prevent the conductive portion from flowing out, the first substrate 200 is not provided with a through hole. It can be understood that the first substrate may have the same structures as the second substrate, such as the through hole, the insulating layer, the contact pad, etc., which are not limited by the embodiments of the present disclosure. In addition, the shape and arrangement manner of the first contact pads CP1 may be the same as or different from the outer profile shape and arrangement manner of the third contact pad; in the case that they are the same, it is more beneficial to form the firm electrical connection therebetween, so the case is preferred.

In some embodiments, the second wire 502 (or the first wire 501) and the first contact pad CP1 are provided on the same surface of the first substrate 100, or the second wire 502 and the first contact pad CP1 are provided on different surfaces of the first substrate 100, respectively. For example, the first contact pad CP1 is provided on the upper surface 102 of the first substrate 100, and the second wire 502 is provided on the lower surface 104; in this case, it is necessary to form a conductive channel connecting the first contact pad CP1 and the driving wire 50 in the first substrate, thereby realizing the electrical connection between the first contact pad CP1 and the first wire 501. For another example, as shown in FIG. 6, the first wire 501 and the first contact pad CP1 are provided on the same surface of the first substrate 100, for example, the upper surface 102, which is conducive to simplifying the manufacturing process because the first wire 501 and the first contact pad CP1 may be integrally formed.

In some embodiments, the second wire 502 (or the first wire 501) and the first contact pad CP1 (or the second contact pad CP2) are made of the same material or different materials. Further, in at least one example, in the case that the second wire 502 and the first contact pad CP1 are provided on the same surface of the first substrate 100 and made of the same material, they may be integrally formed to simplify the manufacturing process, so this is a preferred solution. For example, the second wire 502 and the first contact pad CP1 are simultaneously formed by a photolithography process using the same material. The photolithography process comprises but is not limited to the following steps: coating photoresist on the layer to form the first contact pad, exposing and developing the photoresist to form a photoresist pattern, etching the layer with the photoresist pattern, removing the remaining photoresist, so that the required first contact pad and driving signal line are formed. In this way, the manufacturing process can be simplified, the number of masks can be reduced, and the manufacturing cost can be reduced.

In some embodiments, the third wire 210 and the third contact pad CP3 (or the fourth contact pad CP4) are made of the same material or different materials. Further, in at least one example, in the case that the third wire 210 and the third contact pad CP3 are provided on the same surface of the second substrate 200 and made of the same material, they may be integrally formed to simplify the manufacturing process. For example, the third wire 210 and the first pad portion 206 are simultaneously formed by a photolithography process using the same material. In this way, the manufacturing process can be simplified, the number of masks can be reduced, and the manufacturing cost can be reduced.

In some embodiments, each of the first substrate and the second substrate comprises a flexible material which is selected from the group consisting of polyethylene terephthalate, ethylene terephthalate, polyether ether ketone, polystyrene, polycarbonate, polyarylate, polyaryl ester, polyester, polyimide, polyvinyl chloride, polyethylene and textile fibers and combination thereof.

In some embodiments, the first wiring terminal, the second wiring terminal, the third wiring terminal, the first connection terminal, the second connection terminal, the third connection terminal, the fourth connection terminal, the fifth connection terminal, the first wire, the second wire, the third wire, the first lead wire, the second lead wire, the first auxiliary wire, the second auxiliary wire, the first contact pad, the second contact pad, the third contact pad, the fourth contact pad, the first wire contact pad, the second wire contact pad are made of metal materials such as copper, silver, aluminum or alloy.

In some embodiments, the insulating layer, the first insulating layer, the second insulating layer, the third insulating layer, the first auxiliary insulating layer, the second auxiliary insulating layer and the third auxiliary insulating layer comprise an organic insulating material or an inorganic insulating material. For example, the organic insulating material comprises polyimide (PI), and the inorganic insulating material comprises silicon dioxide, nitrogen oxide or silicon oxynitride.

In some embodiments, the shielding layer comprises an insulating substrate and a conductive material filled in the insulating substrate; for example, the insulating substrate is made of epoxy resin, and the filled conductive material is copper powder, graphite powder, etc. Alternatively, in some embodiments, the shielding layer is made of a metal material.

In some embodiments, the adhesive layer, the first auxiliary adhesive layer and the second auxiliary adhesive layer adopt epoxy resin or polyethylene, etc.

In some embodiments, the first circuit board and the second circuit board are flexible circuit board or rigid circuit board. The rigid circuit board has strong heat dissipation ability but has a relatively large thickness. The flexible circuit board is a printed circuit board made of flexible insulating material, which has the characteristics of high bendability, high density of wire, small thickness, low weight and the like, and has been widely used in electronic products. Therefore, the flexible circuit board is preferred.

The embodiments of the present disclosure further provide a manufacturing method for manufacturing the display device of any one of the above embodiments. In the following, the manufacturing method of the display device will be specifically explained by taking the manufacturing of the display device shown in FIG. 1 as an example.

For example, the manufacturing method of the display device shown in FIG. 1 comprises:

S1, providing the display panel.

For example, as shown in FIGS. 1 and 2, the display panel comprises the display area AA and the peripheral area EA surrounding the display area AA. The display area AA comprises the plurality of sub-pixels P provided in an array, and the plurality of scanning lines GL and the plurality of data lines DL intersecting each other, the plurality of scanning lines GL extend along the first direction (for example, the X direction shown in the drawing), and the plurality of data lines DL extend along the second direction (for example, the Y direction shown in the drawing) different from the first direction.

For example, as shown in FIG. 2, the plurality of first connection terminals CT1, the plurality of second connection terminals CT2, the plurality of third connection terminals CT3, the plurality of fourth connection terminals CT4, the plurality of fifth connection terminals CT5 and the driving control circuit IC are provided in the peripheral area EA on the first side (for example, the lower side shown in the drawing) of the display panel. As shown by the dashed box A in FIG. 2, the plurality of first connection terminals CT1 are spaced from the plurality of second connection terminals CT2, and the driving control circuit IC is electrically connected with the plurality of first connection terminals CT1 and the plurality of second connection terminals CT2. The plurality of fifth connection terminals CT5 are electrically connected with the plurality of second connection terminals CT2 by connection wires. The total number of the first connection terminals CT1 is larger than that of the fifth connection terminals CT5, and the fifth connection terminals CT5 are closer to the edge of the lower side of the display panel 20 than the first connection terminals CT1 and the second connection terminals CT2.

S2, forming the flexible circuit board, in which the flexible circuit board is to be electrically connected with the display panel.

For example, as shown in FIG. 2, the first wiring terminal LT1, the second wiring terminal LT2 and the third wiring terminal LT3 are provided on a side of the flexible circuit board (for example, the upper side shown in the drawing).

As shown in the dashed box B of FIG. 2, in the cross-sectional view FF, the first wiring terminal LT1 is electrically connected with the third connection terminal CT3. As shown in the dashed box C of FIG. 2, in the cross-sectional view GG, the second wiring terminal LT2 is electrically connected with the fourth connection terminal CT4. As shown in the dashed frame A of FIG. 2, the third wiring terminal LT3 is electrically connected with the fifth connection terminal CT5, and the connection manner between the fifth connection terminal CT5 and the third wiring terminal LT3 is the same as that between the third connection terminal CT3 and the first wiring terminal LT1.

Figure 23:
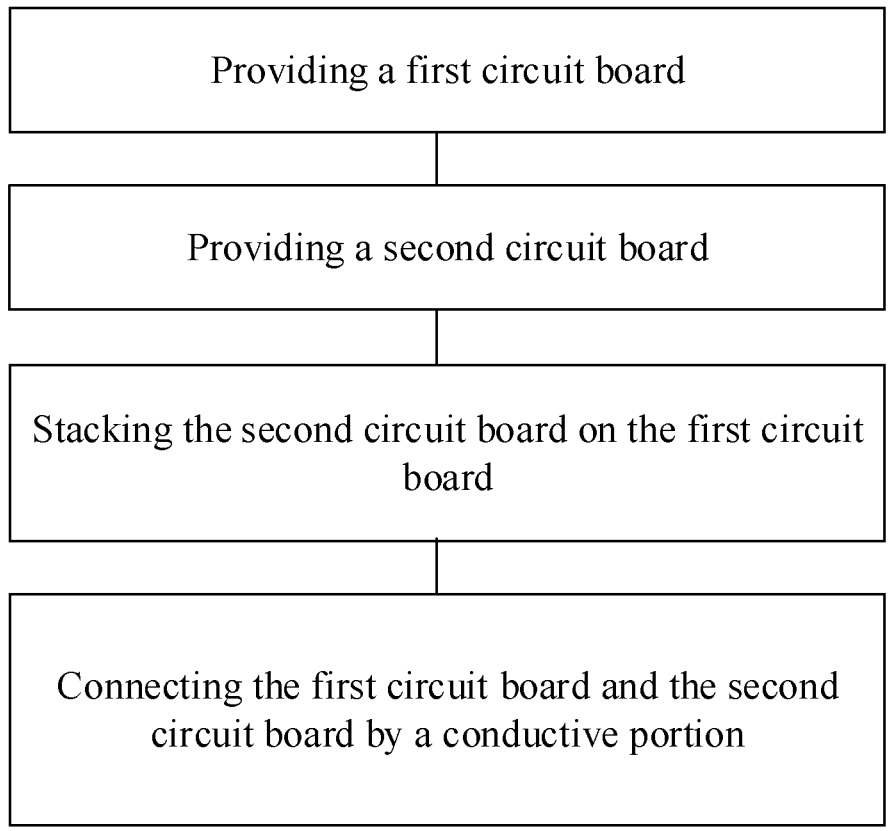
FIG. 23 is a flowchart of a manufacturing method of a display device according to an embodiment of the present disclosure.

FIG. 23 is a flowchart of the manufacturing method of the display device according to the embodiments of the present disclosure. For example, as shown in FIG. 23, the forming the flexible circuit board comprises the following steps S201: providing the first circuit board 11. For example, as shown in FIG. 2, FIG. 3A, FIG. 4 and FIG. 5A, the first circuit board 11 comprises the first substrate 100, and the main contact pad, the first wire 501 and the second wire 502 provided on the first substrate 100. The main contact pad comprises the first contact pad CP1 and the second contact pad CP2, the first wire is electrically connected with the first contact pad CP1 and the second wire is electrically connected with the second contact pad CP2.

S202: providing the second circuit board 22. For example, as shown in FIG. 2, FIG. 3A, FIG. 4 and FIG. 5B, the second circuit board 22 comprises the second substrate 200, and the relay contact pad and the third wire 210 provided on the second substrate 200. The relay contact pad comprises the third contact pad CP3 and the fourth contact pad CP4, and the third wire electrically connects the third contact pad CP3 and the fourth contact pad CP4.

S203: stacking the second circuit board 22 on the first circuit board 11 so that the second circuit board 22 is provided on the side of the first contact pad CP1 and the second contact pad CP2 away from the first substrate 100.

S204: electrically connecting the main contact pad of the first circuit board and the relay contact pad of the second circuit board through the conductive portion. For example, the conductive portion comprises the first conductive portion 33 and the second conductive portion (not shown in the drawing). The first contact pad CP1 and the third contact pad CP3 are electrically connected with each other through the first conductive portion 33. The second contact pad CP2 and the fourth contact pad CP4 are electrically connected with each other through the second conductive portion.

In the manufacturing method of the display device according to the embodiments, the main contact pad is provided on the first circuit board, the relay contact pad is provided on the second circuit board, and the first wire and the second wire provided on the first circuit board are respectively connected with two ends of the third wire provided on the second circuit board through the conductive portion of the second circuit board. Compared with the conventional display device, the display device according to the embodiments can reduce the density of wires and the total number of layers for providing the wires on the flexible circuit board, prevent the interference between the wires, and improve the defect-free ratio of wires.

In some embodiments, before stacking the second circuit board on the first circuit board, the manufacturing method further comprises:

coating the soldering material on the third contact pad and the fourth contact pad of the second circuit board.

For example, as shown in FIG. 6, the solder material is coated on the first pad portion 206 of the second circuit board 22.

In some embodiments, before stacking the second circuit board on the first circuit board, the manufacturing method further comprises:

coating the soldering material on the first contact pad and the second contact pad of the first circuit board; and coating the soldering material on the third contact pad and the fourth contact pad of the second circuit board.

For example, as shown in FIG. 6, the soldering material is coated on the first pad portion 206 of the second circuit board 22, and the soldering material is coated on the first contact pad CP1 of the first circuit board 11.

In some embodiments, after stacking the second circuit board on the first circuit board, the manufacturing method further comprises:

heating the first circuit board and the second circuit board so that liquid soldering material enters the through hole and flows to the first substrate through the through hole.

For example, referring to FIG. 6, the soldering material is coated on the first pad portion 206 corresponding to each first through hole 220, and then the soldering material is heated so that liquid soldering material enters the first through hole 220 and flows to the first substrate 100 through the first through hole 220. After the soldering material solidifies, the soldering material is connected with the first contact pad CP1 on the first substrate 100, thereby forming the signal channel. Furthermore, in at least one example, the above-mentioned soldering material is coated by SMT reflow soldering process. Compared with the conventional method of manually soldering two FPCs, the SMT reflow soldering process is used to connect the two FPCs together to enhance the soldering firmness.

In some embodiments, as shown in FIG. 6, before heating the first circuit board and the second circuit board, the manufacturing method further comprises: forming the first insulating layer 252 on the side of the first pad portion 206 away from the second substrate 200, and forming the first opening 262 in the first insulating layer 252, in which the first opening 262 exposes the first through hole 220 and a portion of the first pad portion 206 around the first through hole 220.

In some embodiments, as shown in FIG. 6, the coating the solder material on the first pad portion 206 of the second circuit board 22 comprises: coating the solder material in the first opening 262 of the first insulating layer 252. By providing the first opening in the first insulating layer, point-to-point automatic soldering can be realized, thereby improving the production efficiency.

In some embodiments, as shown in FIG. 6, the first opening 262 exposes the first through hole 220 and exposes a portion of the first pad portion 206 provided around the first through hole 220. In this way, because the first through hole 220 is exposed in the first opening 262, it is convenient for the solder material to be filled into the first through hole 220 through the first opening 262, thereby further ensuring the electrical connection between the first conductive portion 33 and the connection portion 205.

Generally speaking, the display device and the manufacturing method thereof according to the embodiments of the disclosure can realize the soldering of more than 20 signal channels in the soldering area within 10 mm*10 mm, which greatly reduces the soldering area required by a single soldering pad and the whole soldering area. Moreover, by combining with the surface mounting technology, a fully automatic soldering method is realized. Compared with manual soldering, not only the soldering area is reduced, but also the assembly efficiency and product competitiveness are improved.

In the disclosure, the following points need to be explained:

(1) The drawings of the embodiments of the disclosure only refer to the structures related to the embodiments of this disclosure, and other structures may refer to general design.

(2) For the sake of clarity, in the drawings for describing the embodiments of the present disclosure, the thickness of layer or region is enlarged or reduced, that is, these drawings are not drawn to actual scale.

(3) The embodiments of the present disclosure and the features in the embodiments can be combined with each other to obtain new embodiments without conflict.

The above is only exemplary embodiments of the present disclosure and is not intended to limit the protection scope of the present disclosure, and the protection scope of the present disclosure is determined by the appended claims.

The invention claimed is:

1. A touch display device, comprising:
   a display panel, comprising:
      a base substrate; and
      a display structure provided on the base substrate; and
      a touch structure, a polarizer and a cover plate, all of which are provided on a side of the display structure away from the base substrate;
   wherein the display structure comprises:
   a display area, wherein a plurality of sub-pixels provided in an array, and a plurality of scanning lines and a plurality of data lines intersecting each other are provided in the display area, the plurality of scanning lines extend along a first direction and the plurality of data lines extend along a second direction different from the first direction; and
   a peripheral area surrounding the display area, wherein a plurality of first connection terminals, a plurality of second connection terminals, a plurality of third connection terminals, a plurality of fourth connection terminals, a plurality of fifth connection terminals and a driving control circuit are provided in the peripheral area on a first side of the display panel;
   a flexible circuit board, electrically connected with the display panel, wherein a side of the flexible circuit board is provided with a plurality of first wiring terminals, a plurality of second wiring terminals and a plurality of third wiring terminals, the plurality of first wiring terminals are respectively electrically connected with the plurality of third connection terminals, the plurality of second wiring terminals are respectively electrically connected with the plurality of fourth connection terminals, the plurality of third wiring terminals are respectively electrically connected with the plurality of fifth connection terminals, and the flexible circuit board comprises:
   a first circuit board comprising a first substrate, and a main contact pad, a first wire and a second wire provided on the first substrate, wherein the main contact pad comprises a first contact pad and a second contact pad, the first wire is electrically connected with the first contact pad, and the second wire is electrically connected with the second contact pad;
   a second circuit board comprising a second substrate, and a relay contact pad and a third wire provided on the second substrate, wherein the relay contact pad comprises a third contact pad and a fourth contact pad, and the third contact pad and the fourth contact pad are connected with each other through the third wire; and
a conductive portion for electrically connecting the main contact pad and the relay contact pad, wherein the conductive portion comprises a first conductive portion and a second conductive portion;
wherein the second circuit board is stacked on the first circuit board, so that the second circuit board is provided on a side of the first contact pad and the second contact pad away from the first substrate, the first contact pad and the third contact pad are electrically connected with each other through the first conductive portion, and the second contact pad and the fourth contact pad are electrically connected with each other through the second conductive portion.

2. The touch display device according to claim 1, wherein the conductive portion and the main contact pad are directly connected with each other.

3. The touch display device according to claim 2, wherein the display panel comprises a base substrate, the plurality of sub-pixels are provided on the base substrate, each sub-pixel comprises an organic electroluminescent element, a touch conductive layer is provided on the organic electroluminescent elements, a plurality of first touch electrodes and a plurality of second touch electrodes are provided in the touch conductive layer, the plurality of first touch electrodes constitute a first touch electrode line extending along the first direction, the plurality of second touch electrodes constitute a second touch electrode line extending along the second direction, the first touch electrode line and second touch electrode line intersecting each other, first touch-electrode wires electrically connected with the first touch electrodes and second touch-electrode wires electrically connected with the second touch electrodes are provided in the peripheral area of the display panel, the first touch-electrode wires are electrically connected with the fourth connection terminals, and the second touch-electrode wires are electrically connected with the third connection terminals.

4. The touch display device according to claim 3, wherein a vertical distance between the touch conductive layer and a plane where the plurality of data lines are located is a first distance, the display panel further comprises a driving control line electrically connected with the driving control circuit through the third wiring terminal, the driving control line intersects the third wire in space, a vertical distance between the driving control line and the third wire is a second distance, and the first distance is different from the second distance.

5. The touch display device according to claim 4, wherein:
the first wire is connected with the first contact pad through a first transition connection portion, the second wire is connected with the second contact pad through a second transition connection portion, and the third wire is connected with the third contact pad and/or the fourth contact pad through a third transition connection portion;
a width of the first transition connection portion is gradually reduced in a direction from the first contact pad to the first wire, a width of the second transition connection portion is gradually reduced in a direction from the second contact pad to the second wire, and a width of the third transition connection portion is gradually reduced in a direction from the third contact pad and/or the fourth contact pad to the third wire.

6. The touch display device according to claim 5, wherein the second circuit board further comprises:
a plurality of through holes penetrating through the second substrate, wherein each through hole is provided to correspond to the main contact pad; and
a connection portion which covers at least a portion of an inner wall of the through hole and is connected with the relay contact pad,
wherein the conductive portion fills in the through hole and is connected with the connection portion, and the conductive portion extends from the through hole toward the first substrate to be connected with the main contact pad on the first substrate.

7. The touch display device according to claim 6, wherein:
the first circuit board comprises a plurality of first contact pads, a plurality of second contact pads, a plurality of first wires and a plurality of second wires;
the plurality of the first contact pads are provided in an array, a first gap exists between two adjacent first contact pads, and at least one first wire of the plurality of first wires passes through the first gap and is connected with another first contact pad different from the two adjacent first contact pads;
the plurality of second contact pads are provided in an array, a second gap exists between two adjacent second contact pads, and at least one second wire of the plurality of second wires passes through the second gap and is connected with another second contact pad different from the two adjacent second contact pads.

8. The touch display device according to claim 7, wherein:
the second circuit board comprises a plurality of third contact pads, a plurality of fourth contact pads and a plurality of third wires;
the plurality of third contact pads are provided in an array, a third gap exists between two adjacent third contact pads, and at least one third wire of the plurality of third wires passes through the third gap and is connected with another third contact pad different from the two adjacent third contact pads;
the plurality of the fourth contact pads are provided in an array, a fourth gap exists between two adjacent fourth contact pads, and at least one another third wire of the plurality of third wires passes through the fourth gap and is connected with another fourth contact pad different from the two adjacent fourth contact pads.

9. The touch display device according to claim 6, wherein the relay contact pad comprises a first portion provided on a side of the second substrate away from the first substrate and a second portion provided on a side of the second substrate close to the first substrate, and the conductive portion is in contact with at least a surface of the second portion of the relay contact pad.

10. The touch display device according to claim 6, wherein the plurality of through holes comprise:
a plurality of first through holes, wherein each first through hole corresponds to the first contact pad and the third contact pad, the plurality of first through holes are provided in a plurality of lines, and the first through holes in odd lines are staggered with the first through holes in even lines;
a plurality of second through holes, wherein each second through hole corresponds to the second contact pad and the fourth contact pad, the plurality of second through holes are provided in a plurality of lines, and the second through holes in odd lines are staggered with the second through holes in even lines.

11. The touch display device according to claim 6, wherein the second circuit board further comprises an insulating layer provided on the second substrate, the insulating layer is provided on a side of the relay contact pad away from the second substrate, and the insulating layer comprises an opening exposing the through hole and exposing a part of the relay contact pad around the through hole.

12. The touch display device according to claim 11, wherein an orthographic projection of the insulating layer on the second substrate and an orthographic projection of the relay contact pad on the second substrate have an overlapping region, and the overlapping region surrounds the orthographic projection of the through hole on the second substrate.

13. The touch display device according to claim 11, wherein a part of the conductive portion extends outward from the through hole to cover the exposed portion of the relay contact pad.

14. The touch display device according to claim 11, wherein the opening of the insulating layer serves as a coating area of a solder material, and the solder material coated in the coating area is configured to flow into a cavity formed by the connection portion and serve as the conductive portion.

15. The touch display device according to claim 6, wherein the second circuit board further comprises an adhesive layer provided on an outer surface of the second substrate, the adhesive layer is configured for adhering the second circuit board to the first circuit board, the second circuit board comprises a bonding region, the through hole is provided in the bonding region, and at least a part of the adhesive layer is provided in the bonding region of the second substrate.

16. The touch display device according to claim 15, wherein the adhesive layer has a hollow portion, and an orthographic projection of the through hole on the adhesive layer is provided in the hollow portion.

17. The touch display device according to claim 16, wherein the hollow portion comprises a central hollow portion and at least one extension hollow portion connected with the central hollow portion, and an orthographic projection of the through hole on the adhesive layer is provided in the central hollow portion.

18. The touch display device according to claim 6, wherein the connection portion comprises a first metal layer and a second metal layer, a metal activity of the second metal layer is lower than that of the first metal layer, and the second metal layer is closer to the conductive portion than the first metal layer.

19. The touch display device according to claim 6, wherein the display panel further comprises a bending area provided between the display area and the driving control circuit, the bending area is bendable along a bending axis, and a plurality of relay holes are provided on a side of the bending axis close to the display area for changing layers of the first touch-electrode wire and the second touch-electrode wire.

20. A touch display device comprising:
a display panel, comprising:
a base substrate;
a display structure provided on the base substrate; and
a touch structure, a polarizer and a cover plate, all of which are provided on a side of the display structure away from the base substrate;
wherein the display structure comprises:
a display area, wherein a plurality of sub-pixels provided in an array, and a plurality of scanning lines and a plurality of data lines intersecting each other are provided in the display area, the plurality of scanning lines extend along a first direction and the plurality of data lines extend along a second direction different from the first direction; and
a peripheral area surrounding the display area, wherein a plurality of first connection terminals, a plurality of second connection terminals, a plurality of third connection terminals, a plurality of fourth connection terminals, a plurality of fifth connection terminals and a driving control circuit are provided in the peripheral area on a first side of the display panel;
a flexible circuit board, electrically connected with the display panel, wherein a side of the flexible circuit board is provided with a plurality of first wiring terminals, a plurality of second wiring terminals and a plurality of third wiring terminals, the plurality of first wiring terminals are respectively electrically connected with the plurality of third connection terminals, the plurality of second wiring terminals are respectively electrically connected with the plurality of fourth connection terminals, the plurality of third wiring terminals are respectively electrically connected with the plurality of fifth connection terminals, and the flexible circuit board comprises:
a first circuit board comprising a first substrate, and a main contact pad, a first wire and a second wire provided on the first substrate, wherein the main contact pad comprises a first contact pad and a second contact pad, the first wire is electrically connected with the first contact pad, and the second wire is electrically connected with the second contact pad;
a second circuit board comprising a second substrate, and a relay contact pad and a third wire provided on the second substrate, wherein the relay contact pad comprises a third contact pad and a fourth contact pad, and the third contact pad and the fourth contact pad are connected with each other through the third wire; and
a conductive portion for electrically connecting the main contact pad and the relay contact pad, wherein the conductive portion comprises a first conductive portion and a second conductive portion;
wherein the second circuit board is stacked on the first circuit board so that the second circuit board is provided on a side of the first contact pad and the second contact pad away from the first substrate, the first contact pad and the third contact pad are electrically connected with each other through the first conductive portion, and the second contact pad and the fourth contact pad are electrically connected with each other through the second conductive portion,
wherein the display panel comprises a base substrate, the plurality of sub-pixels are provided on the base substrate, each sub-pixel comprises an organic electroluminescent element, a touch conductive layer is provided on the organic electroluminescent elements, a plurality of first touch electrodes and a plurality of second touch electrodes are provided in the touch conductive layer, the plurality of first touch electrodes constitute a first touch electrode line extending along the first direction, the plurality of second touch electrodes constitute a second touch electrode line extending along the second direction, the first touch electrode line and second touch electrode line intersect each other, first touch-electrode wires electrically connected with the first touch electrodes and second touch-electrode wires electrically connected with the second touch electrodes are provided in the peripheral area of the display panel, the first touch-electrode wires are electrically connected with the fourth connection terminals, and the second touch-electrode wires are electrically connected with the third connection terminals, wherein a vertical distance between the touch conductive layer and a plane where the plurality of data lines are located is a first distance, the display panel further comprises a driving control line electrically connected with the driving control circuit through the third wiring terminal, the driving control line intersects the third wire in space, a vertical distance between the driving control line and the third wire is a second distance, and the first distance is different from the second distance, and wherein the first distance is smaller than the second distance.

* * * * *